(12) United States Patent
Kosugi et al.

(10) Patent No.: US 10,136,562 B2
(45) Date of Patent: Nov. 20, 2018

(54) UNDERWATER DATA CENTER

(71) Applicant: FUJITSU LIMITED, Kawasaki-shi, Kanagawa (JP)

(72) Inventors: Naofumi Kosugi, Yokohama (JP); Susumu Takahashi, Yokohama (JP); Kiyomasa Kamei, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/640,621

(22) Filed: Jul. 3, 2017

(65) Prior Publication Data

US 2018/0054916 A1 Feb. 22, 2018

(30) Foreign Application Priority Data

Aug. 16, 2016 (JP) ................. 2016-159497

(51) Int. Cl.
| | |
|---|---|
| *H05K 7/20* | (2006.01) |
| *H05K 7/14* | (2006.01) |
| *B63C 11/00* | (2006.01) |
| *B63C 11/49* | (2006.01) |
| *B63G 8/00* | (2006.01) |
| *B63C 11/46* | (2006.01) |
| *H04B 13/02* | (2006.01) |
| *B63C 11/42* | (2006.01) |
| *B63C 11/52* | (2006.01) |
| *B63G 8/22* | (2006.01) |
| *G03B 17/08* | (2006.01) |
| *G01C 13/00* | (2006.01) |

(52) U.S. Cl.
CPC ........ *H05K 7/2079* (2013.01); *H05K 7/1497* (2013.01); *H05K 7/20709* (2013.01); *H05K 7/20818* (2013.01); *B63C 11/00* (2013.01); *B63C 11/42* (2013.01); *B63C 11/46* (2013.01); *B63C 11/49* (2013.01); *B63C 11/52* (2013.01); *B63G 8/001* (2013.01); *B63G 8/22* (2013.01); *G01C 13/00* (2013.01); *G03B 17/08* (2013.01); *H04B 13/02* (2013.01)

(58) Field of Classification Search
None
See application file for complete search history.

(56) References Cited

U.S. PATENT DOCUMENTS

| | | | | |
|---|---|---|---|---|
| 2005/0225936 A1* | 10/2005 | Day | ................. | H05K 7/20754 361/679.47 |
| 2012/0012278 A1* | 1/2012 | Noteboom | ......... | H05K 7/20736 165/96 |

(Continued)

FOREIGN PATENT DOCUMENTS

| | | | | |
|---|---|---|---|---|
| JP | 02-157361 | * | 6/1990 | ............... E04H 1/00 |
| JP | 2-157361 | | 6/1990 | |

*Primary Examiner* — Dimary Lopez Cruz
*Assistant Examiner* — Zhengfu Feng
(74) *Attorney, Agent, or Firm* — Fujitsu Patent Center

(57) ABSTRACT

An underwater data center includes an electronic device; a housing member that houses the electronic device and that is configured to be disposed under water; and a heat exchanger that is provided at the housing member and that is configured to discharge, into the water, heat discharged from the electronic device, with a face of the heat exchanger that discharges the heat making contact with the water, an opening being formed in a bottom face of the housing member and placing an inside of the housing member in communication with the water.

20 Claims, 21 Drawing Sheets

(56) References Cited

U.S. PATENT DOCUMENTS

2013/0044426 A1* 2/2013 Neumann .................. G06F 1/20
 361/679.54
2015/0321739 A1* 11/2015 Dehlsen ................... B63G 8/18
 165/45
2015/0382511 A1* 12/2015 James ................ H05K 7/20709
 361/679.46

* cited by examiner

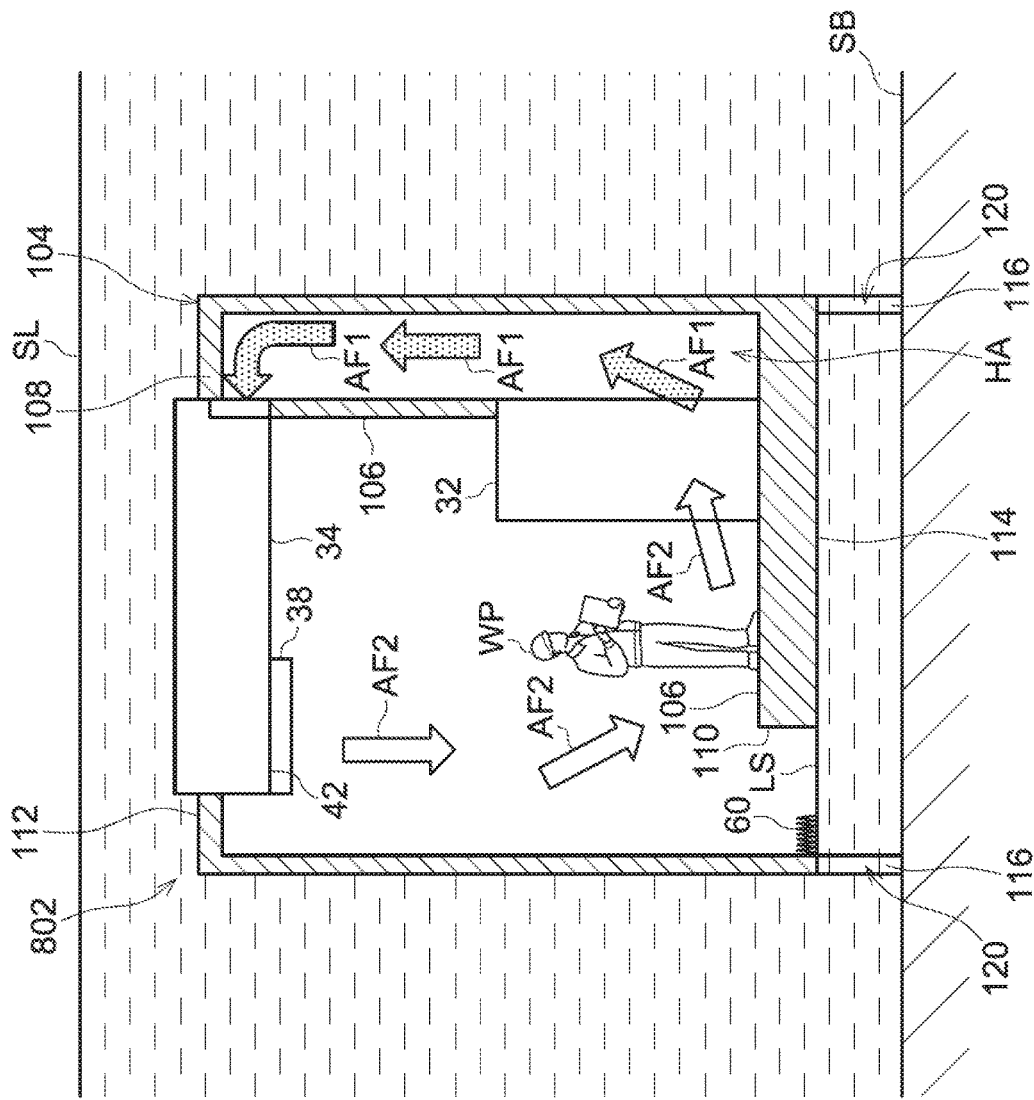

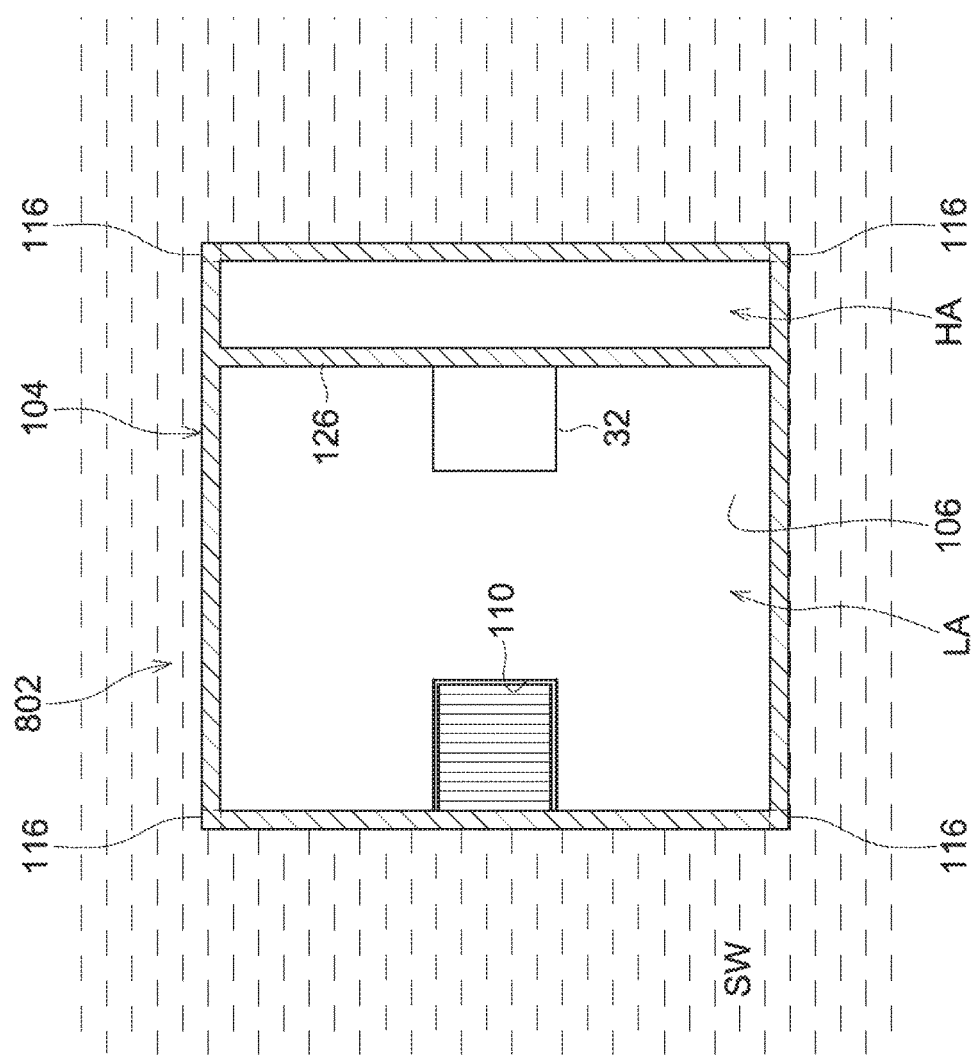

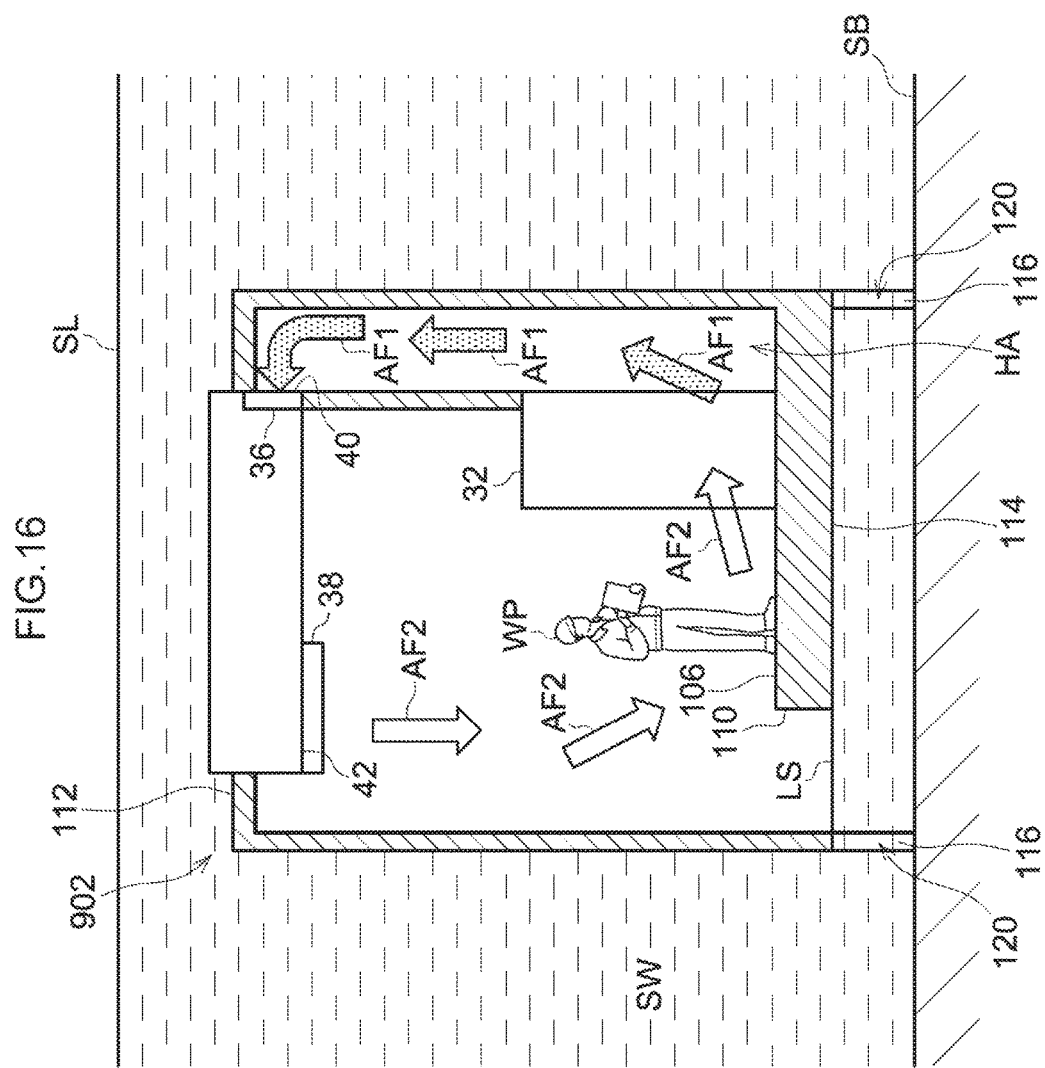

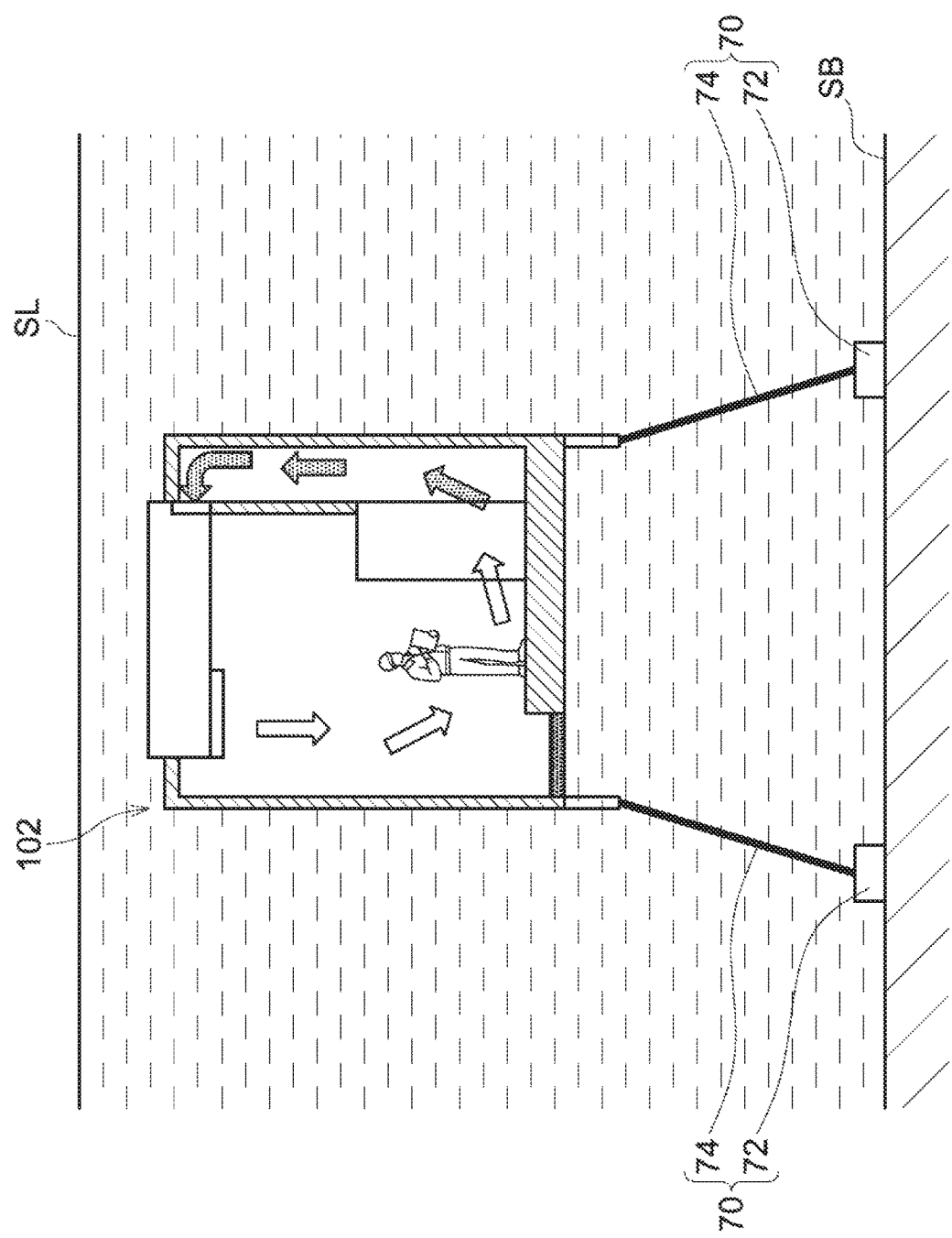

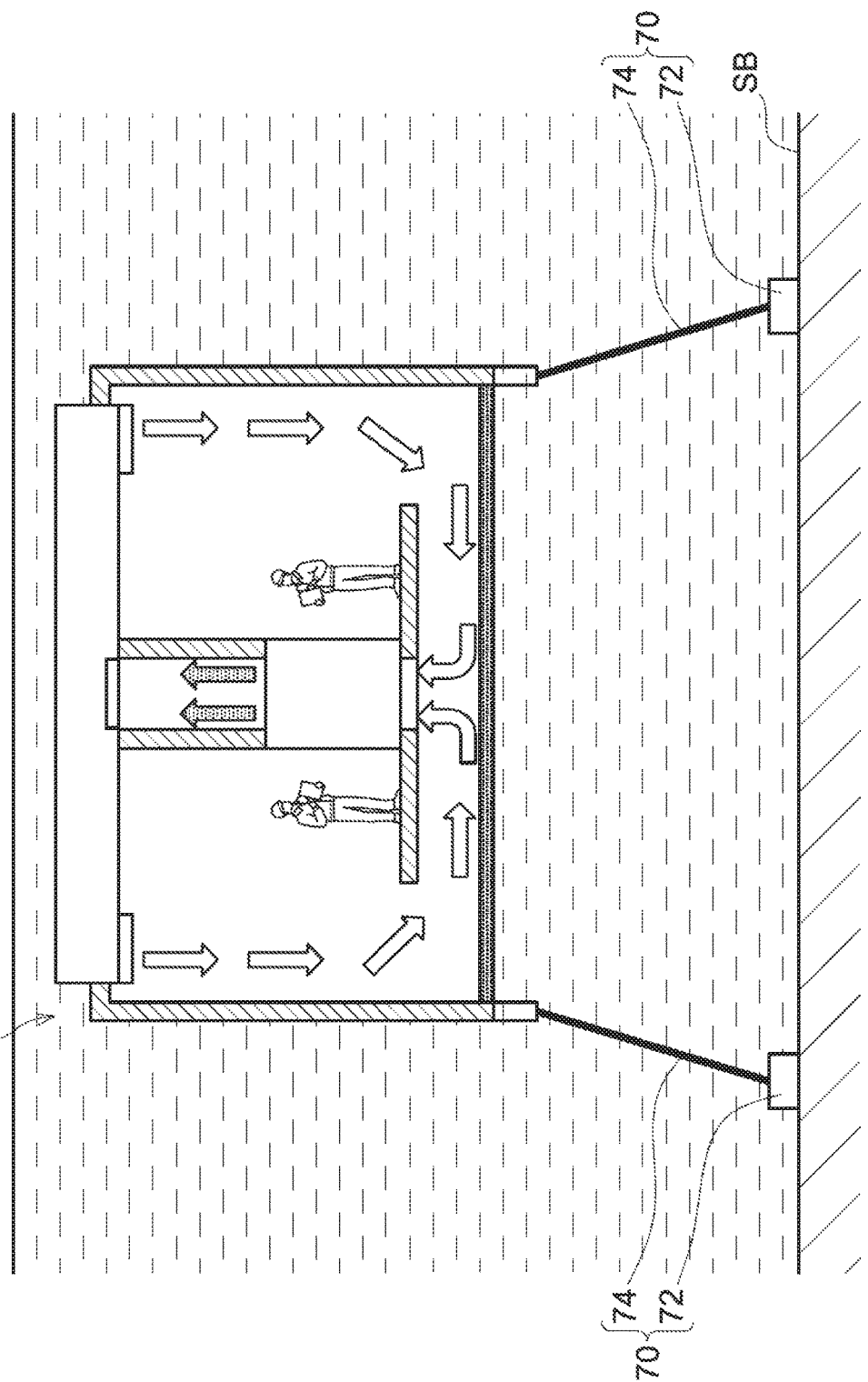

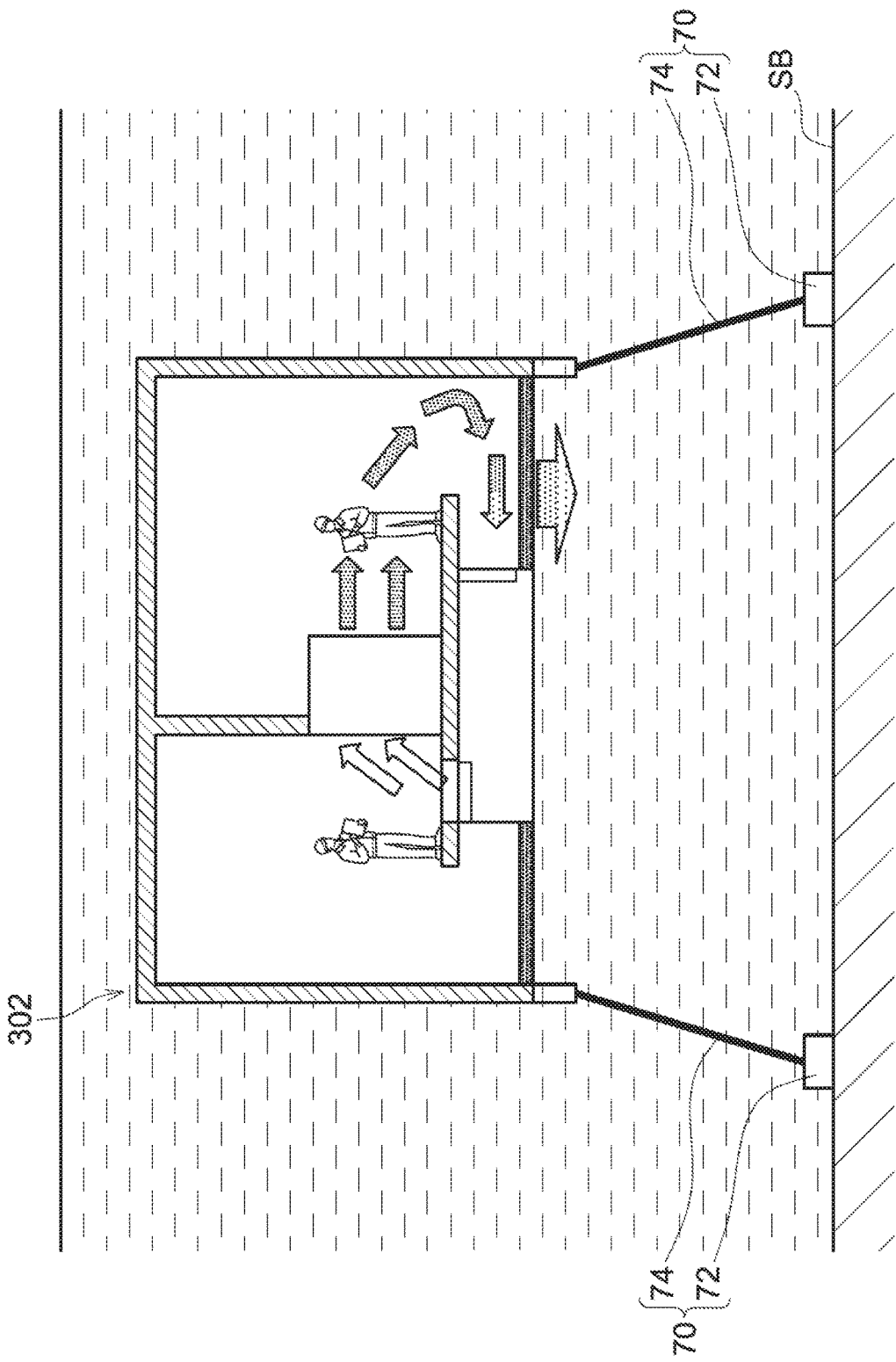

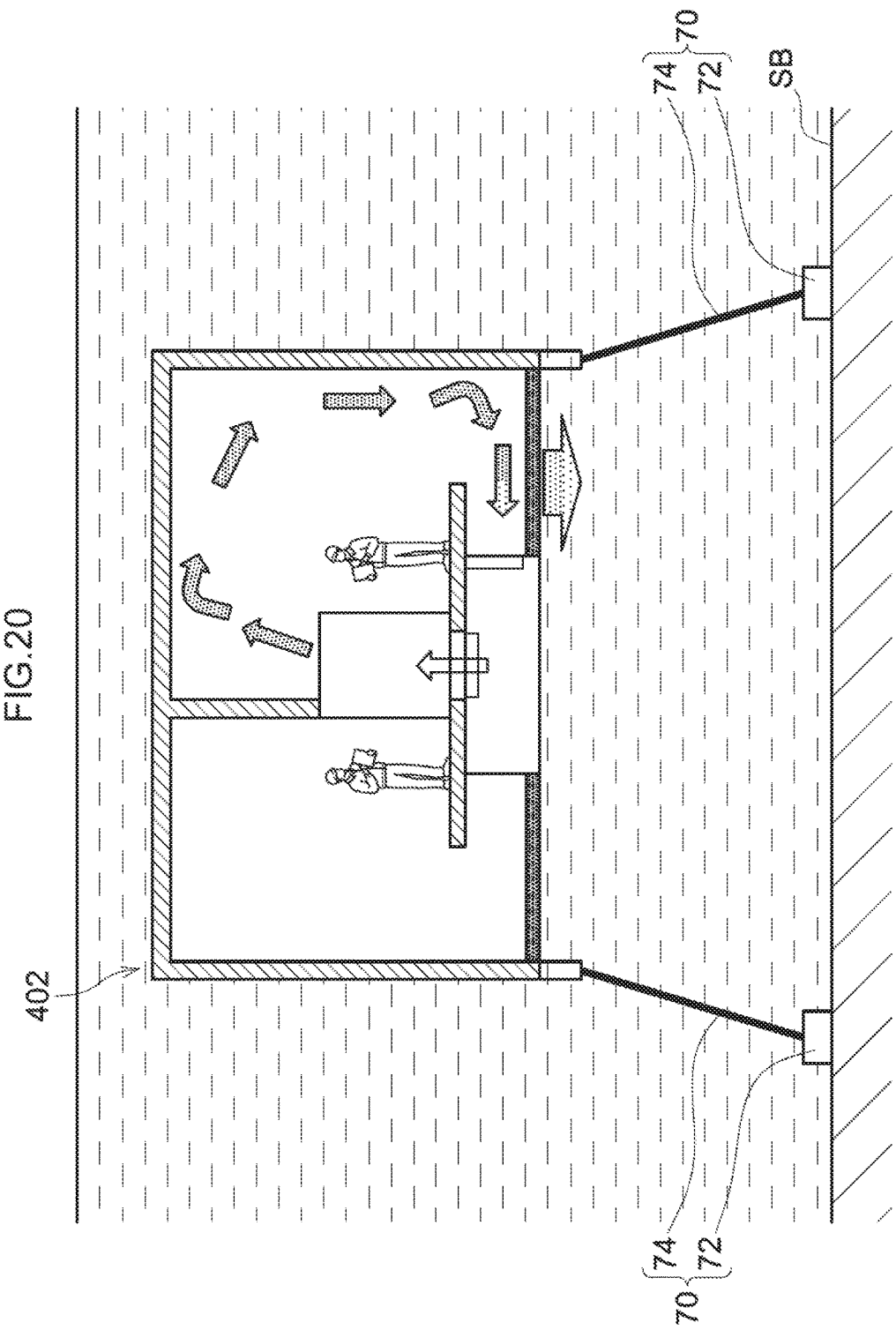

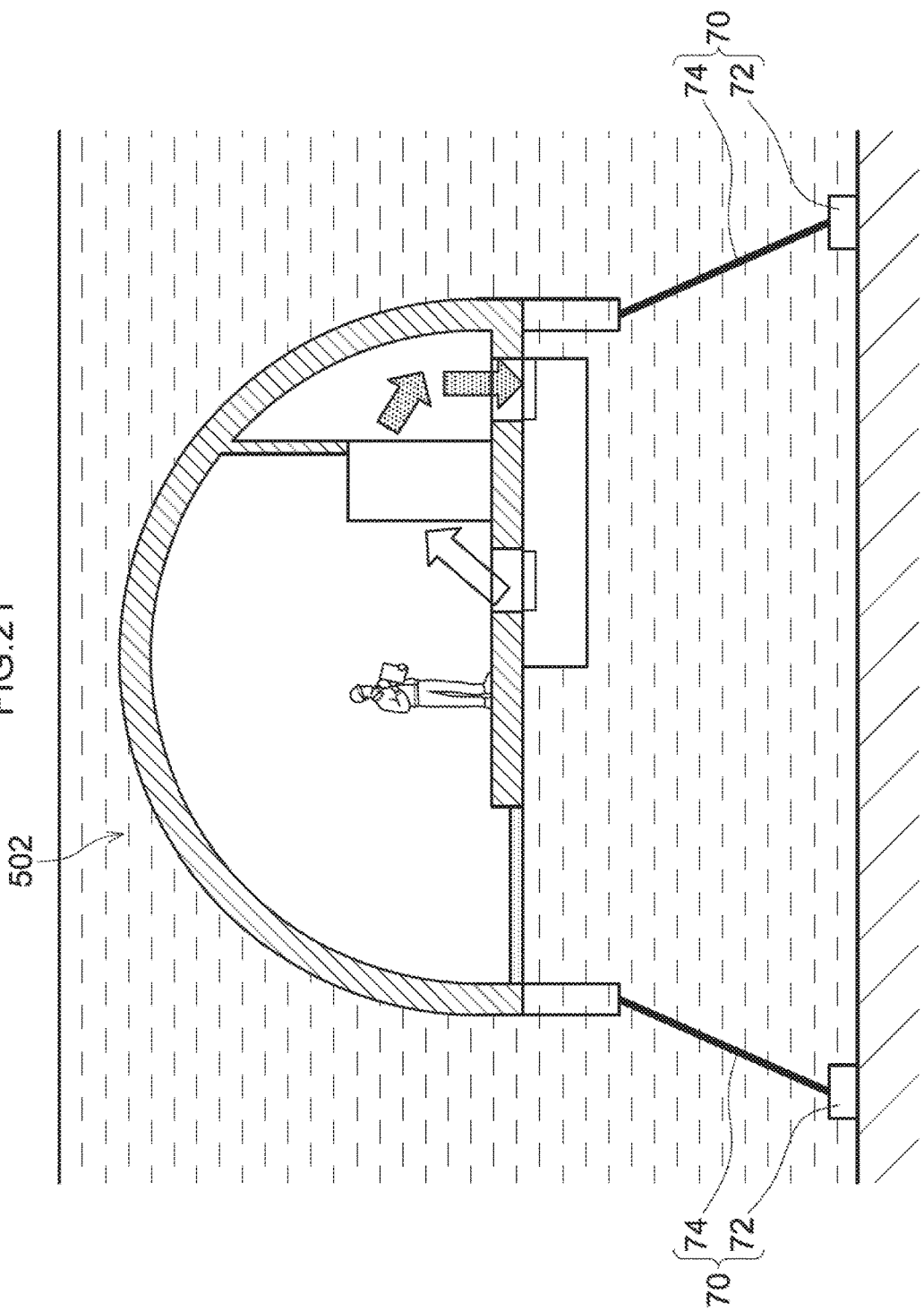

UNDERWATER DATA CENTER

CROSS-REFERENCE TO RELATED APPLICATION

This application is based upon and claims the benefit of priority of the prior Japanese Patent Application No. 2016-159497, filed on Aug. 16, 2016, the entire contents of which are incorporated herein by reference.

FIELD

The embodiments discussed herein are related to an underwater data center.

BACKGROUND

A known simplified underwater base is provided with a deck at a bottom portion of a chamber internally filled with air, and is provided with an opening that opens part of the bottom portion. An air purifying apparatus that circulates and purifies air inside the chamber is also provided to an escape passage over a hatch at an upper portion of the chamber.

Additionally, in one example of a data center, plural data center modules are arranged under water, for example, under the sea, in a lake, or in a river.

RELATED PATENT DOCUMENTS

Japanese Laid-Open Patent Publication No. H02-157361
United States Patent Publication No. 2015/0382511 A1

SUMMARY

According to an aspect of the embodiments, an underwater data center includes an electronic device, a housing member, a heat exchanger, and an opening. The housing member houses the electronic device and is configured to be disposed under water. The heat exchanger is provided at the housing member and is configured to discharge, into the water, heat discharged from the electronic device. A face of the heat exchanger that discharges the heat makes contact with the water. An opening is formed in a bottom face of the housing member and places an inside of the housing member in communication with the water.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 14 is a vertical cross-section illustrating an underwater data center of the eighth exemplary embodiment.

FIG. 15 is a cross-section taken along line 15-15 in FIG. 13 illustrating an underwater data center of the eighth exemplary embodiment.

FIG. 16 is a vertical cross-section illustrating an underwater data center of a ninth exemplary embodiment.

FIG. 17 is a vertical cross-section illustrating a modified example of the underwater data center of the first exemplary embodiment.

FIG. 18 is a vertical cross-section illustrating a modified example of the underwater data center of the second exemplary embodiment.

FIG. 19 is a vertical cross-section illustrating a modified example of the underwater data center of the third exemplary embodiment.

FIG. 20 is a vertical cross-section illustrating a modified example of the underwater data center of the fourth exemplary embodiment.

FIG. 21 is a vertical cross-section illustrating a modified example of the underwater data center of the fifth exemplary embodiment.

DESCRIPTION OF EMBODIMENTS

Detailed explanation follows regarding an underwater data center of a first exemplary embodiment, with reference to the drawings.

Figure 1:
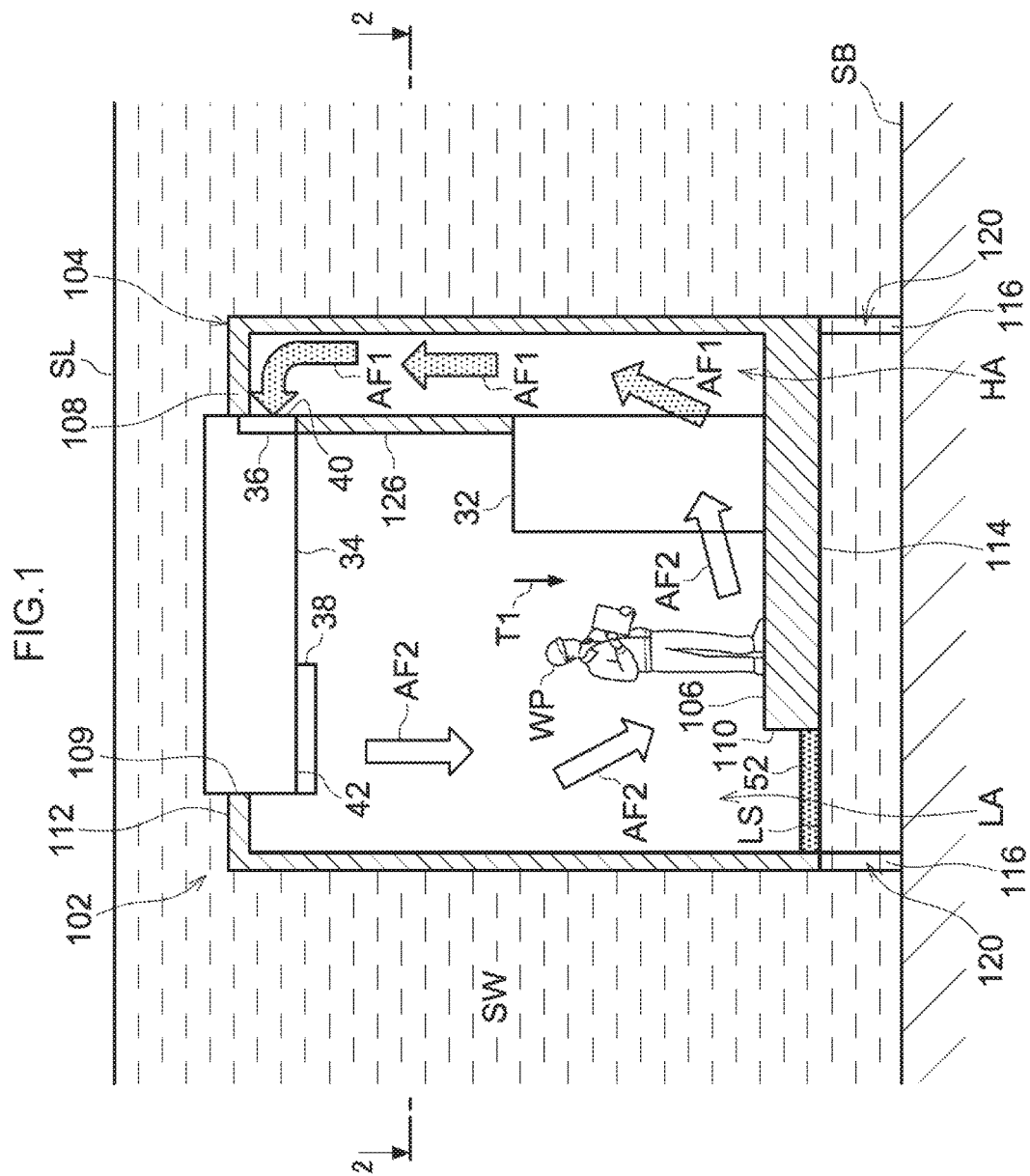
FIG. 1 is a vertical cross-section illustrating an underwater data center of a first exemplary embodiment.

As illustrated in FIG. 1, an underwater data center 102 of a first exemplary embodiment is, for example, installed under the sea and used in an environment in which it is surrounded by sea water SW. There is no limitation to the location where the underwater data center 102 is installed so long as the location is under water, and instead of under the sea, for example, may be in a lake or a pond, or may be in a river.

The underwater data center 102 includes an electronic device 32. The electronic device 32 is housed in a housing member 104. The electronic device 32 includes, for example, a storage device that stores data, a transceiver that exchanges data with an external device, a processing device that performs predetermined processing on data, a controller that controls the exchange of data and so on.

There is no particular limitation to specific examples of the transceiver of the electronic device 32. For example, in an underwater data center provided with an antenna, the transceiver may perform wireless data exchange. In such a case, the reliable exchange of electromagnetic waves is possible if the antenna is disposed above sea level SL. The transceiver may also have a structure that performs wired data exchange using a cable. In an underwater data center having a structure that performs wired data exchange, a communication cable extends from the electronic device 32, passes through the housing member 104, and extends to outside the housing member 104.

The electronic device 32 includes a fan (not illustrated in the drawings). Driving the fan enables gas inside the housing member 104 to be introduced into the electronic device 32 and gas to be discharged from the electronic device 32 into the housing member 104. Driving the fan passes gas through the electronic device 32 to cool the electronic device 32.

The gas inside the housing member 104 is, for example, air. Alternatively, a gas in which the nitrogen gas mixture ratio has been increased by a predetermined proportion compared to air may be employed so as to increase an anticorrosive effect inside the housing member 104.

There is no limitation to the shape of the housing member 104 so long as it is able to house the electronic device 32. In the example illustrated in FIG. 1 and FIG. 2, the housing member 104 has a rectangular box shape. Instead of such a rectangular shape, the housing member 104 may, for example, have a circular tube shape or an angular tube shape, or may have a hemispherical shape as in the fifth exemplary embodiment described below.

Power for the electronic device 32 and a heat exchanger 34, described below, may, for example, be supplied from the outside of the housing member 104 using a power cable. In such a case, in addition to the communication cable described above, the power cable also passes through the housing member 104. Portions where such various cables pass through the housing member 104 are sealed by a sealing member or the like such that sea water SW does not inadvertently ingress into the housing member 104.

Note that the power for the electronic device 32 and the heat exchanger 34 may be supplied using a tidal generator that employs tidal forces in the sea water.

In the underwater data center 102 of the first exemplary embodiment, the housing member 104 includes a bottom plate 106. The electronic device 32 is installed on the bottom plate 106. The bottom plate 106 not only supports the electronic device 32, but also secures a work space for when a workperson WP performs work, as described below. Namely, on the bottom plate 106, there is an area where the electronic device 32 is installed and an area where a workperson WP performs work.

In the first exemplary embodiment, a mounting hole 109 is formed in a top plate 108 of the housing member 104. The heat exchanger 34 is fitted into and mounted in the mounting hole 109. Namely, the heat exchanger 34 forms part of a top face 112 of the housing member 104. An upper portion of the heat exchanger 34 is a face that discharges heat from inside the heat exchanger 34 and is in contact with the sea water SW. An inner edge of the mounting hole 109 and an outer edge of the heat exchanger 34 are sealed by a sealing member or the like such that sea water SW does not ingress into the housing member 104.

The heat exchanger 34 includes an intake fan 36. The intake fan 36 is driven such that gas discharged from the electronic device 32 flows toward the heat exchanger 34 and is taken into the heat exchanger 34 through an inlet 40 of the heat exchanger 34, as illustrated by arrows AF1. Since the temperature of sea water SW is lower than that inside the heat exchanger 34, heat from the gas taken into the heat exchanger 34 is discharged into the sea water SW and the gas is cooled.

The heat exchanger 34 includes an exhaust fan 38. The exhaust fan 38 is driven such that gas cooled by the heat exchanger 34 is discharged from an outlet 42 into the housing member 104. As illustrated by arrows AF2, this gas then flows toward the electronic device 32.

Gas thus cooled passes through the electronic device 32 such that heat emitted by the electronic device 32 is transferred to the gas and the electronic device 32 is cooled. The gas heated by the electronic device 32 then moves toward the heat exchanger 34 once again. Namely, heat from the electronic device 32 is discharged into the sea water SW via the heat exchanger 34 as gas is circulated between the electronic device 32 and the heat exchanger 34, thereby enabling the electronic device 32 to be cooled. Note that even in cases in which the heat exchanger 34 does not include the intake fan 36 and the exhaust fan 38, airflow similar to that described above can be generated by the operation of a fan mounted to the electronic device 32.

A partitioning plate 126 is disposed between the electronic device 32 and the heat exchanger 34. The partitioning plate 126 partitions the inside of the housing member 104 into a high temperature area HA and a low temperature area LA. The high temperature area HA is an area between the partitioning plate 126 and one side wall (a first side wall 128A). The low temperature area LA is an area between the partitioning plate 126 and another side wall (a second side wall 128B).

The inlet 40 of the heat exchanger 34 is positioned in the high temperature area HA. The high temperature area HA is an area where high temperature gas that has been heated by the electronic device 32 due to passing through the electronic device 32 flows toward the heat exchanger 34 (see the arrows AF1).

The outlet 42 of the heat exchanger 34 is positioned in the low temperature area LA. The low temperature area LA is an area where low temperature gas that has been cooled by the heat exchanger 34 flows toward the electronic device 32 (see the arrows AF2).

Thus, since the inside of the housing member 104 is partitioned by the partitioning plate 126, high temperature gas output from the electronic device 32 and low temperature gas output from the heat exchanger 34 do not mix inside the housing member 104. It is desirable that one face of the partitioning plate 126 be in contact with the high temperature area HA and another face of the partitioning plate 126 be in contact with the low temperature area LA such that the partitioning plate 126 guides the flow of air in each area. With such a partitioning plate structure, a structure may be adopted in which there is, for example, an internal air layer or insulating layer containing an insulating material.

Figure 2:
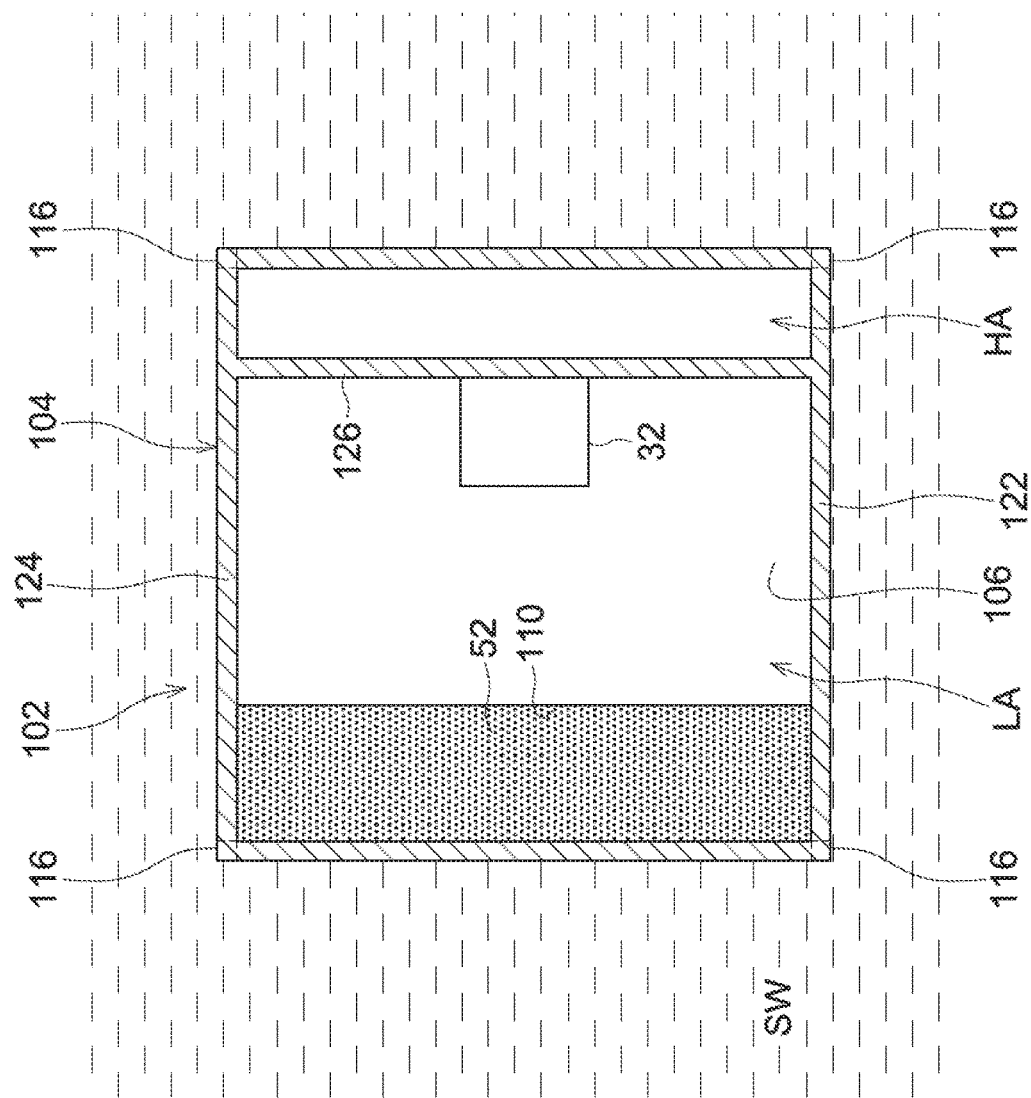
FIG. 2 is a cross-section taken along line 2-2 in FIG. 1 illustrating an underwater data center of the first exemplary embodiment.

An opening 110 is formed in the bottom plate 106 of the housing member 104 so as to pass through the bottom plate 106 along a thickness direction. The shape of the opening 110 when viewed along the thickness direction (the arrow T1 direction) of the bottom plate 106 is a shape through which a workperson WP can pass to perform, for example, maintenance or inspection work on the electronic device 32. In the first exemplary embodiment, as illustrated in FIG. 2, the opening 110 is an opening spanning from a front wall 122 to a rear wall 124 of the housing member 104. Note that the front wall 122 and the rear wall 124 are thus named merely for ease of explanation, and the front and rear when actually installing the underwater data center are not limited thereto.

The opening 110 is formed in the bottom plate 106, namely, in a bottom face 114 of the housing member 104. Sea water thus does not flow into the housing member 104 through the opening 110, even in a state in which the underwater data center 102 has been installed in sea water SW (under water).

A liquid film 52 is provided in the opening 110. The liquid film 52 is a film formed by a liquid with a specific gravity that is lower than that of sea water, that is insoluble in sea water, and that is nonvolatile. The film covers a liquid surface LS of the sea water SW in the opening 110. Namely, the liquid film 52 is in a state covering the liquid surface LS. Evaporation of sea water SW is thereby suppressed, thus suppressing evaporated components from diffusing into the housing member 104. Also, since the liquid film 52 is nonvolatile, evaporation of the liquid film 52 is suppressed. In the first exemplary embodiment in particular, as is apparent from FIG. 2, the entire surface of the liquid surface LS is covered by the liquid film 52. Accordingly, sea water SW does not evaporate from the liquid surface LS.

Note that the liquid film 52 is formed by a liquid, and thus has fluidity. Accordingly, the liquid film 52 does not impede passage of a workperson WP when the workperson WP passes through the opening 110.

Plural legs 116 extend downward from the housing member 104. In the present exemplary embodiment, the housing member 104 has a rectangular box shape, and as illustrated in FIG. 2, the legs 116 are provided at the four corner positions of the housing member 104.

As illustrated in FIG. 1, the underwater data center 102 makes contact with a sea bottom SB through the legs 116. The bottom plate 106 of the housing member 104 is maintained at a uniform distance (height) from the sea bottom SB by the legs 116. Spaces 120 through which a workperson WP can pass through are formed between the legs 116 and the sea bottom SB.

Explanation follows regarding operation of the first exemplary embodiment.

In the underwater data center 102 of the first exemplary embodiment, heat from the electronic device 32 is discharged to the outside of the underwater data center 102 by the heat exchanger 34. Since the underwater data center 102 is installed under the sea, the heat conversion efficiency of the underwater data center 102 is higher than that of a data center installed, for example, in open air. Namely, in the underwater data center 102, it is possible to secure high performance cooling of the electronic device 32 at a low cost.

The inside of the housing member 104 is partitioned by the partitioning plate 126. This thereby forms the high temperature area HA, this being an area on the inlet 40 side of the heat exchanger 34, and the low temperature area LA, this being an area on the outlet 42 side of the heat exchanger 34. Accordingly, high temperature gas output from the electronic device 32 and low temperature gas output from the heat exchanger 34 do not mix, thus increasing the heat exchange efficiency of the heat exchanger 34 and enabling the electronic device 32 to be cooled efficiently.

In the underwater data center 102, the opening 110 is formed in the bottom plate 106, namely, in the bottom face 114 of the housing member 104. A workperson WP who performs maintenance work, inspection work, or the like on the electronic device 32 can pass through the opening 110 to enter into the housing member 104. When performing maintenance work or the like on the electronic device 32, there is no need to raise the underwater data center 102 above the surface of the water (above the sea level SL), resulting in excellent serviceability. Maintenance work and the like can thus be performed on the electronic device 32 at a low cost and in a short amount of time.

Moreover, with a structure such as that described above, in which a workperson WP can enter into the housing member 104 and perform maintenance work or the like, electronic device 32 redundancy, namely, providing an excess of the electronic devices 32 in preparation against failures and the like is unnecessary. It is better to use fewer electronic devices 32 in order to be able to reduce the size of the underwater data center. The underwater data center can also be built and installed at a low cost and in a short amount of time.

Plural of the legs 116 extend downward from the housing member 104. The legs 116 make contact with the sea bottom SB so as to be able to stably maintain the underwater data center 102 at a predetermined position. The spaces 120 are formed between the sea bottom SB and the legs 116. A workperson WP can pass through a space 120, pass under the bottom face 114, and move to the opening 110.

The opening 110 is covered by the liquid film 52, eliminating the contact area between the sea water SW and the air inside the housing member 104. Sea water SW does not evaporate at the opening 110, thereby enabling an increase in humidity inside the housing member 104 to be suppressed.

The liquid film 52 is formed by a nonvolatile liquid that has a specific gravity lower than that of sea water SW and that is insoluble in sea water. In the opening 110, the entire liquid surface LS of the sea water SW can therefore be covered. Additionally, passage is not impeded when a workperson WP passes through the opening 110.

In the first exemplary embodiment, the heat exchanger 34 is mounted to the top face 112, this being an upper portion of the housing member 104. Since the opening 110 of the bottom face 114 is not provided at the top face 112, the surface area of the top face 112 is larger than the surface area of the bottom plate 106. Thus, for example, a large-scale heat exchanger having a large contact area with the sea water SW can be employed, since the heat exchanger 34 is mounted to the top face 112, which has a larger surface area than the bottom plate 106.

Explanation follows regarding a second exemplary embodiment. In the second exemplary embodiment, elements, members, and the like that are similar to those of the first exemplary embodiment are appended with the same reference numerals, and detailed explanation thereof is omitted.

Figure 3:
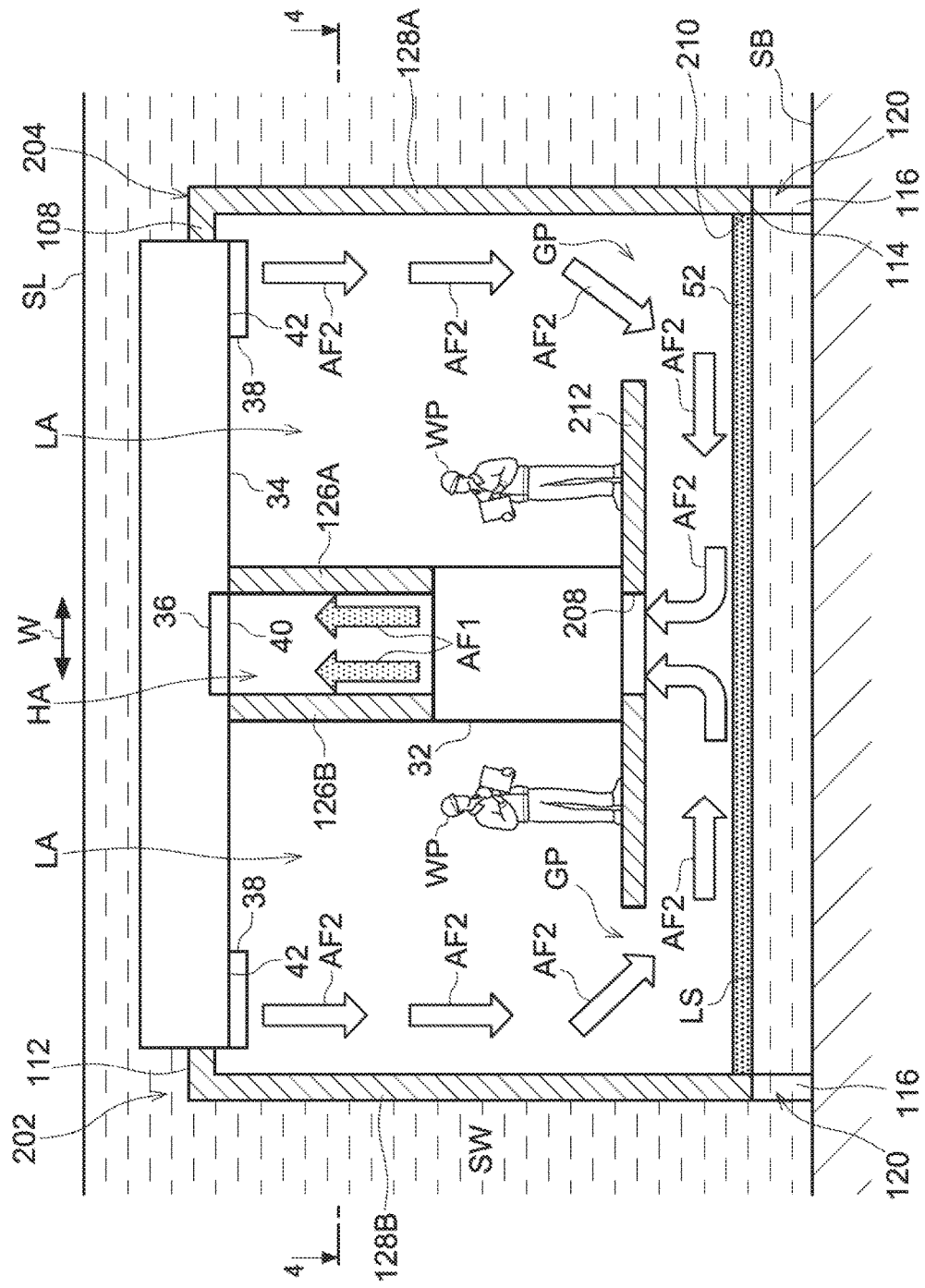
FIG. 3 is a vertical cross-section illustrating an underwater data center of a second exemplary embodiment.

As illustrated in FIG. 3, in an underwater data center 202 of the second exemplary embodiment, an entire bottom face 114 of a housing member 204 is open so as to form an opening 210. The entire liquid surface LS of the sea water SW in the opening 210 is covered by the liquid film 52.

Figure 4:
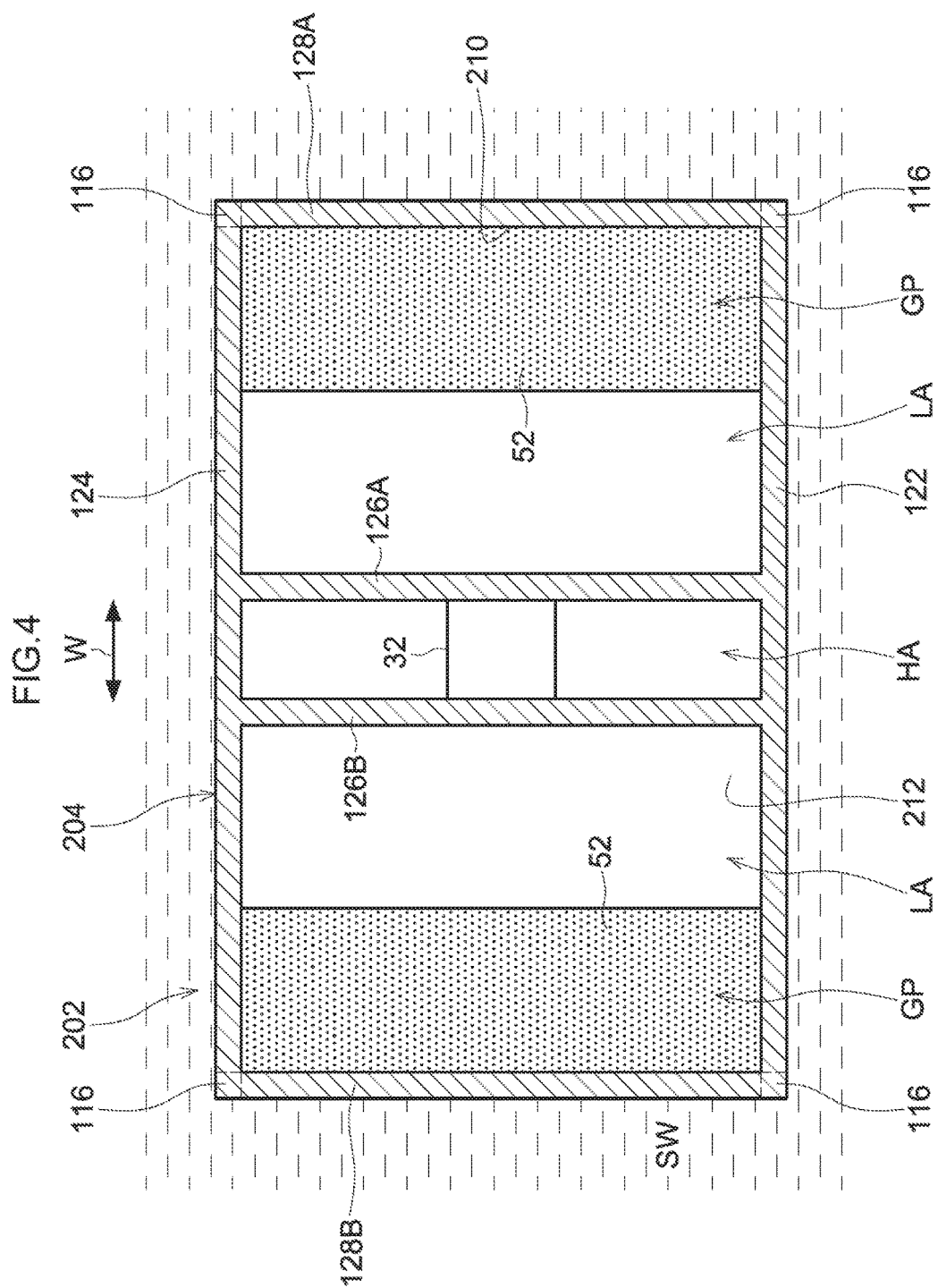
FIG. 4 is a cross-section taken along line 4-4 in FIG. 3 illustrating an underwater data center of the second exemplary embodiment.

A support plate 212 is provided inside the housing member 204 at a position above a liquid film 52 (the opening 210). In the example illustrated in FIG. 4, the support plate 212 spans between a front wall 122 and a rear wall 124 of the housing member 204. Gaps GP arise between the support plate 212, and a first side wall 128A and a second side wall 128B.

An electronic device 32 is installed on and supported by the support plate 212. On the support plate 212, there is an area for installing the electronic device 32 and an area where a workperson WP performs work. In the example illustrated in FIG. 3 and FIG. 4, the electronic device 32 is positioned at a width direction (the arrow W direction) center inside the housing member 204. A through-hole 208 is formed in the support plate 212 at a position below the electronic device 32 so as to pass through the support plate 212 along a thickness direction. Namely, at the opening 210, there is a gap between the liquid surface and the support plate 212, and the through-hole 208, through which gas flows from the gap to the electronic device 32, is formed in the support plate 212.

In the second exemplary embodiment, two partitioning plates 126A and 126B are disposed between the electronic device 32 and a heat exchanger 34. The two partitioning plates 126A and 126B are parallel to each other. The area between the partitioning plates 126A and 126B is a high temperature area HA, and the area between the partitioning plate 126A and the first side wall 128A and between the partitioning plate 126B and the second side wall 128B are a low temperature area LA.

Accordingly, in the second exemplary embodiment, as illustrated by arrows AF1 in FIG. 3, gas heated by the electronic device 32 rises up through the high temperature area HA and enters the heat exchanger 34 through an inlet 40. As illustrated by arrows AF2, gas cooled by the heat exchanger 34 is output from outlets 42 and falls down through the low temperature area LA. The gas then passes between the liquid film 52 and the support plate 212, through the through-hole 208, and passes through the electronic device 32 to cool the electronic device 32.

In the second exemplary embodiment, gas cooled by the heat exchanger 34 flows along the liquid film 52. Accordingly, in cases in which the temperature of the gas is higher than the temperature of the liquid film 52 (of the sea water SW), heat from the gas is transferred to the sea water, further cooling the gas. As is apparent from FIG. 3, since the liquid film 52 is present over the entire surface of the bottom face 114 of the housing member 204, heat from the gas can be transferred to the sea water over a larger surface area than in a structure in which a liquid film is present over only part of the bottom face 114.

Explanation follows regarding a third exemplary embodiment. In the third exemplary embodiment, elements, members, and the like that are similar to those of the first exemplary embodiment or the second exemplary embodiment are appended with the same reference numerals, and detailed explanation thereof is omitted.

Figure 5:
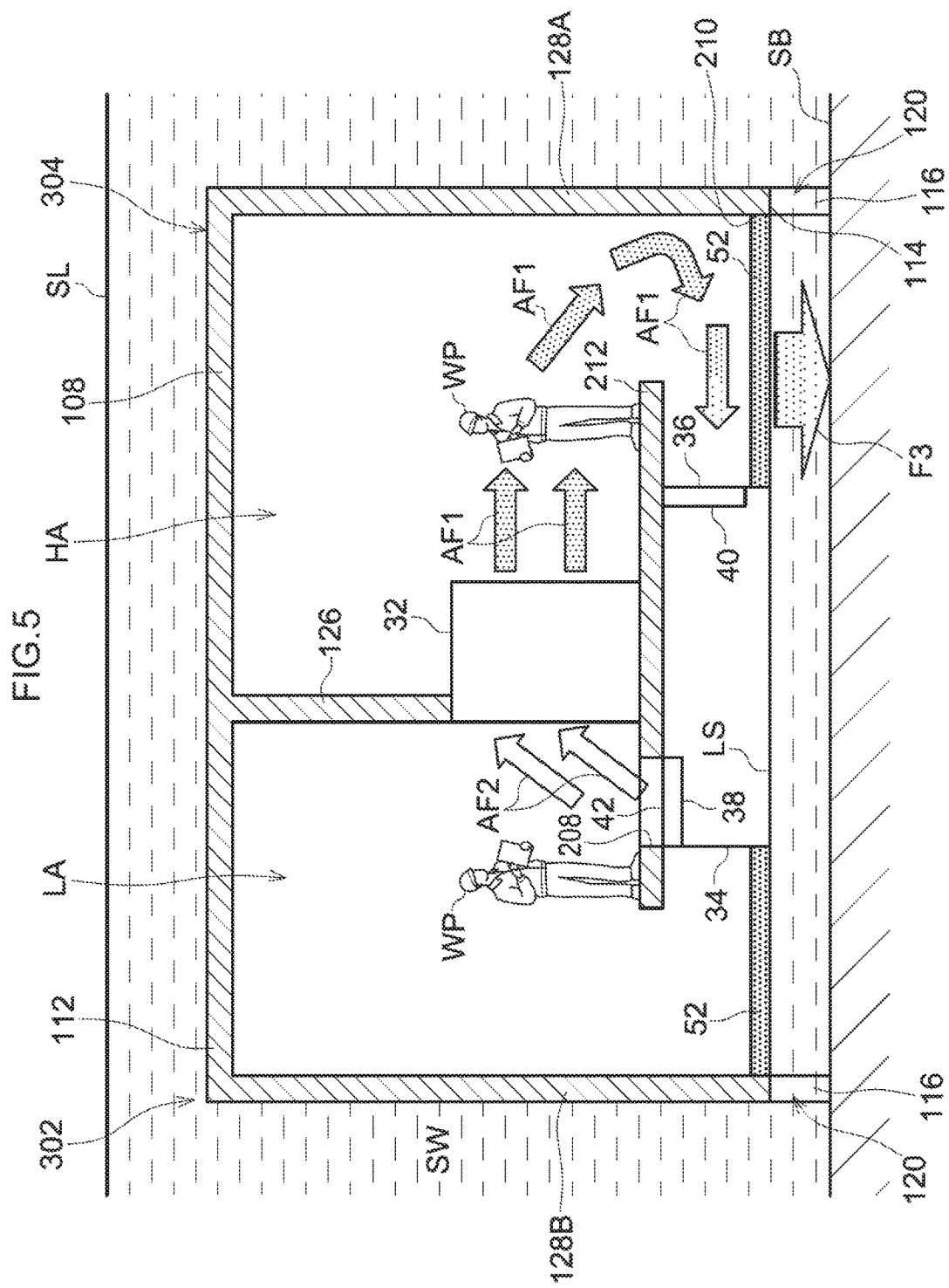
FIG. 5 is a vertical cross-section illustrating an underwater data center of a third exemplary embodiment.

As illustrated in FIG. 5, in an underwater data center 302 of the third exemplary embodiment, a heat exchanger 34 is mounted to a lower face of a support plate 212 inside a housing member 304. A lower portion of the heat exchanger 34 is a face through which internal heat is discharged, and is in contact with the sea water SW. A liquid film 52 is formed between the heat exchanger 34 and a first side wall 128A, and between the heat exchanger 34 and a second side wall 128B.

An electronic device 32 is installed on the support plate 212. A partitioning plate 126 is provided between the electronic device 32 and a top plate 108. The partitioning plate 126 partitions the inside of the housing member 304 into a high temperature area HA and a low temperature area LA. Since the inside of the underwater data center 302 is divided into the high temperature area HA and the low temperature area LA by the partitioning plate 126, high temperature air in the high temperature area HA and low temperature air in the low temperature area LA do not mix when a workperson WP enters into the underwater data center 302.

A through-hole 208 is formed in the support plate 212 at a low temperature area LA side away from the electronic device 32.

In the third exemplary embodiment, the heat exchanger 34 forms part of a bottom face 114 of the housing member 304. The heat exchanger 34 is installed so as to make effective use of the open portion of the housing member 304. Further, a sealing member is not needed between the heat exchanger 34 and the housing member 304. This enables installation cost of the heat exchanger 34 to be reduced.

In the third exemplary embodiment, gas cooled by the heat exchanger 34 at a previous stage is in contact with the liquid film 52. Accordingly, in cases in which the temperature of the gas is higher than the temperature of the liquid film 52 (of the sea water SW), heat from the gas is transferred to the sea water as illustrated by the arrow F3 and the gas is cooled.

Moreover, in the third exemplary embodiment, the heat exchanger 34 is mounted to the lower face of the support plate 212, and air flows along a short path from the heat exchanger 34 to the electronic device 32. Thus, in FIG. 5 there is little disturbance to airflow by movement of a workperson WP, even when the workperson WP moves within the range of the opening 210 to the left of the support plate 212.

Explanation follows regarding a fourth exemplary embodiment. In the fourth exemplary embodiment, elements, members, and the like that are similar to those of the first to the third exemplary embodiments are appended with the same reference numerals, and detailed explanation thereof is omitted.

Figure 6:
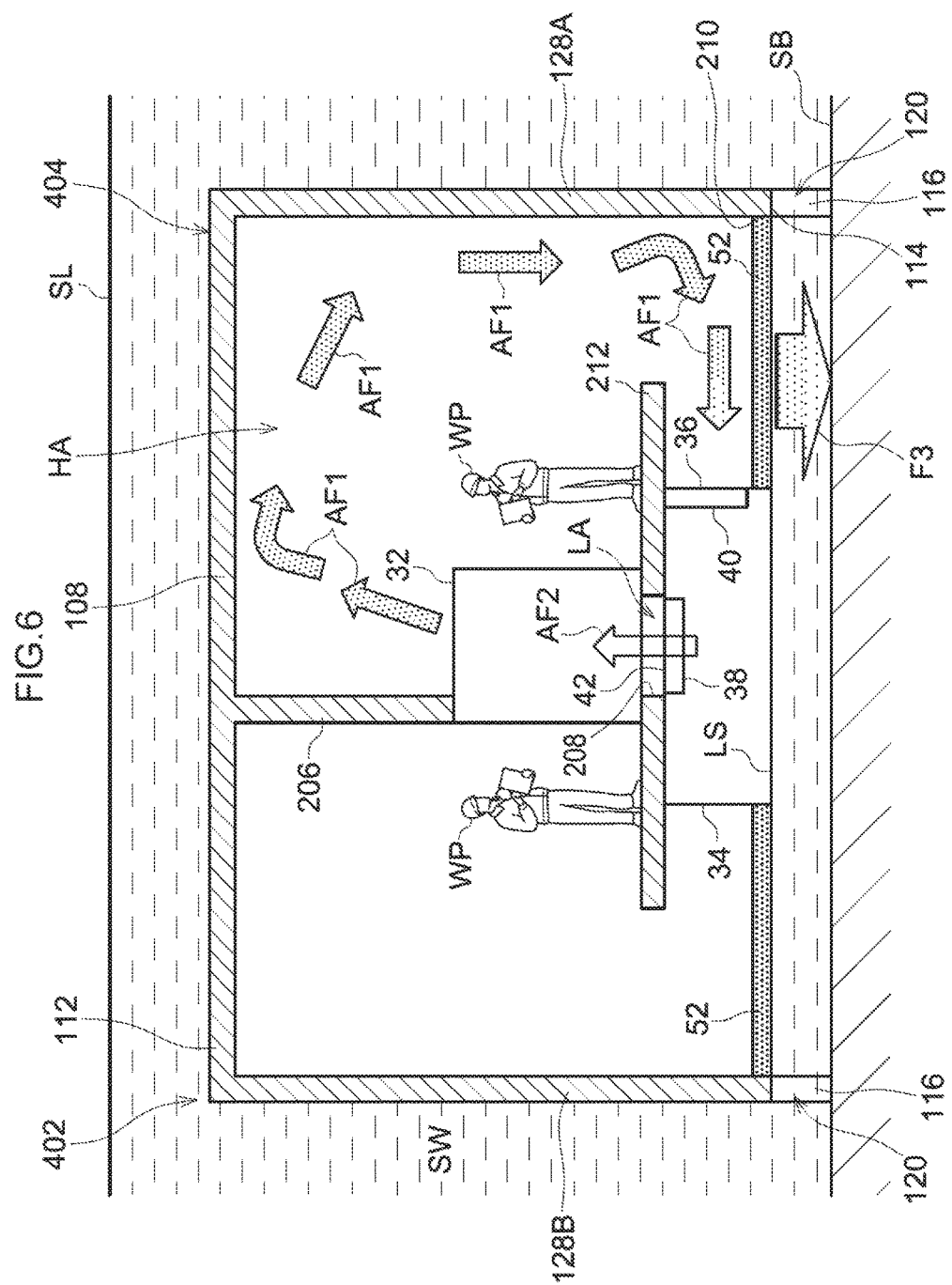
FIG. 6 is a vertical cross-section illustrating an underwater data center of a fourth exemplary embodiment.

As illustrated in FIG. 6, in an underwater data center 402 of the fourth exemplary embodiment, inside a housing member 404 there is a through-hole 208 of a support plate 212 positioned below an electronic device 32. Namely, an outlet 42 for gas from a heat exchanger 34 faces the electronic device 32.

Accordingly, in the fourth exemplary embodiment, low temperature gas generated by the heat exchanger 34 flows directly into the electronic device 32, enabling the electronic device 32 to be efficiently cooled.

The heat exchanger 34 is installed at a lower face of the housing member 404, namely, at an open portion. Since a sealing member is not needed between the heat exchanger 34 and the housing member 404, the installation cost of the heat exchanger 34 can be reduced.

Note that in the fourth exemplary embodiment, a gap between the heat exchanger 34 and the electronic device 32 is in effect a low temperature area LA, and spaces other than this are a high temperature area HA. Although an example is given in which a vertical wall 206 is provided between the electronic device 32 and a top plate 108 in FIG. 6, the low temperature area LA and the high temperature area HA can be formed inside the housing member 404 even when the vertical wall 206 is not provided.

Moreover, in the fourth exemplary embodiment, the outlet 42 for gas from the heat exchanger 34 faces the electronic device 32, and air from the heat exchanger 34 flows directly to the electronic device 32. Thus, in FIG. 6 there is little disturbance to airflow by the movement of a workperson WP, even when the workperson WP moves within the range of the opening 210 to the left of the support plate 212.

In the first to the fourth exemplary embodiments described above, application of a suitably arranged exemplary embodiment can be made in accordance with the position of the inlets for gas from the electronic device 32. For example, the first exemplary embodiment and the third exemplary embodiment can be applied to an electronic device into which cooling gas flows from the side, and the second exemplary embodiment and the fourth exemplary embodiment can be applied to an electronic device into which cooling gas flows from below.

Explanation follows regarding a fifth exemplary embodiment. In the fifth exemplary embodiment, elements, members, and the like that are similar to those of the first to the fourth exemplary embodiments are appended with the same reference numerals, and detailed explanation thereof is omitted.

Figure 7:
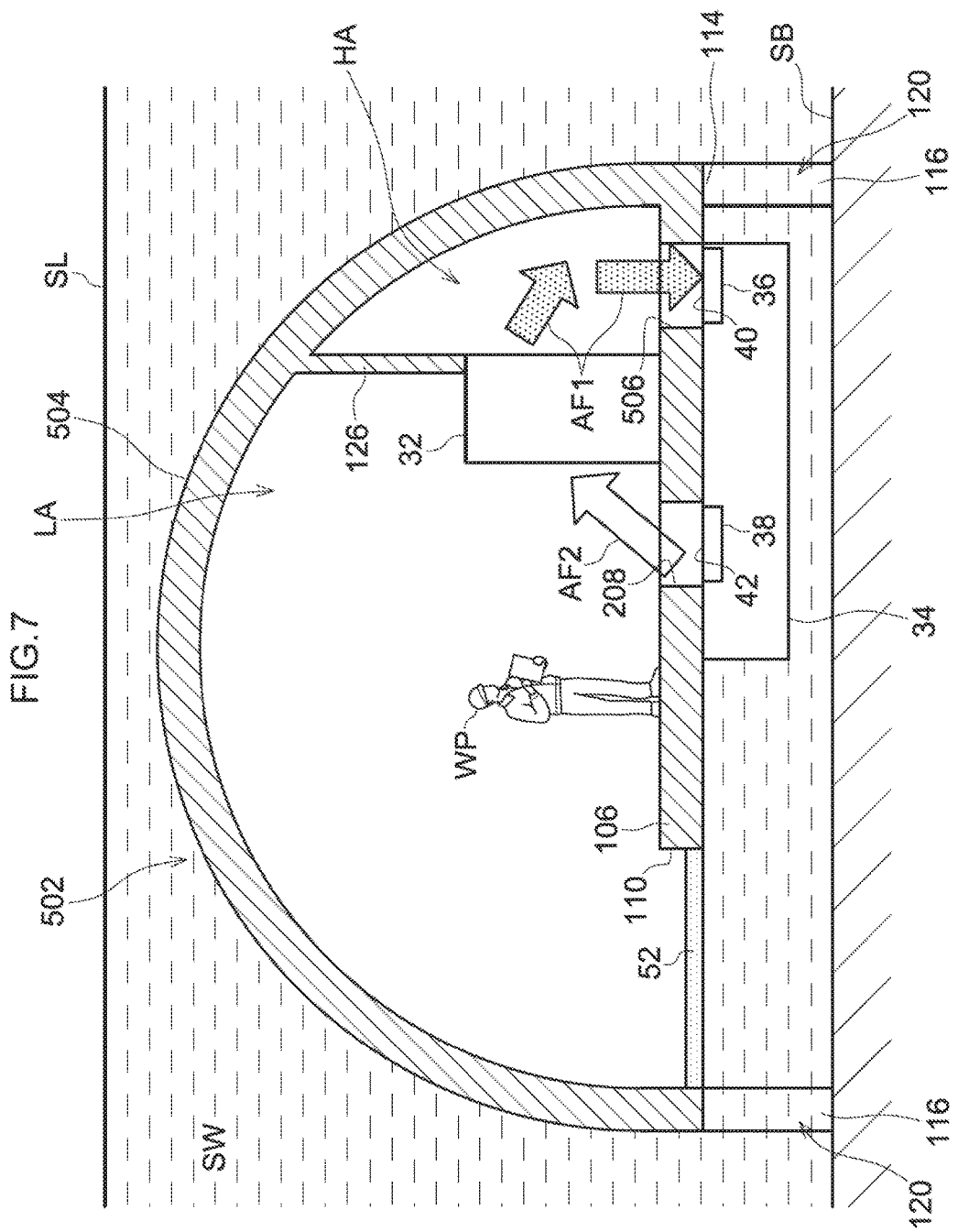
FIG. 7 is a vertical cross-section illustrating an underwater data center of a fifth exemplary embodiment.

As illustrated in FIG. 7, in an underwater data center 502 of the fifth exemplary embodiment, a housing member 504 has a hemispherical shape that is convex on top. An electronic device 32 is installed on a bottom plate 106, and a heat exchanger 34 is mounted below the bottom plate 106. In addition to a through-hole 208 through which air output from the heat exchanger 34 passes, a through-hole 506 through which air entering into the heat exchanger 34 passes is also formed in the bottom plate 106.

Thus, in the fifth exemplary embodiment, since the housing member 504 has a hemispherical shape, the housing member 504 has a high strength with respect to outside forces, for example, water pressure from the sea water SW, enabling the shape of the housing member 504 to be stably maintained.

The members given below in the sixth to the eighth exemplary embodiments illustrate examples of members that may be employed instead of the liquid film 52 described above.

Note that in the sixth to the eighth exemplary embodiments, although examples are given in which the overall structure of the respective underwater data center is the same as the structure of the first exemplary embodiment, the respective structures may also be that of the underwater data center of the second to the fifth exemplary embodiments.

Figure 8:
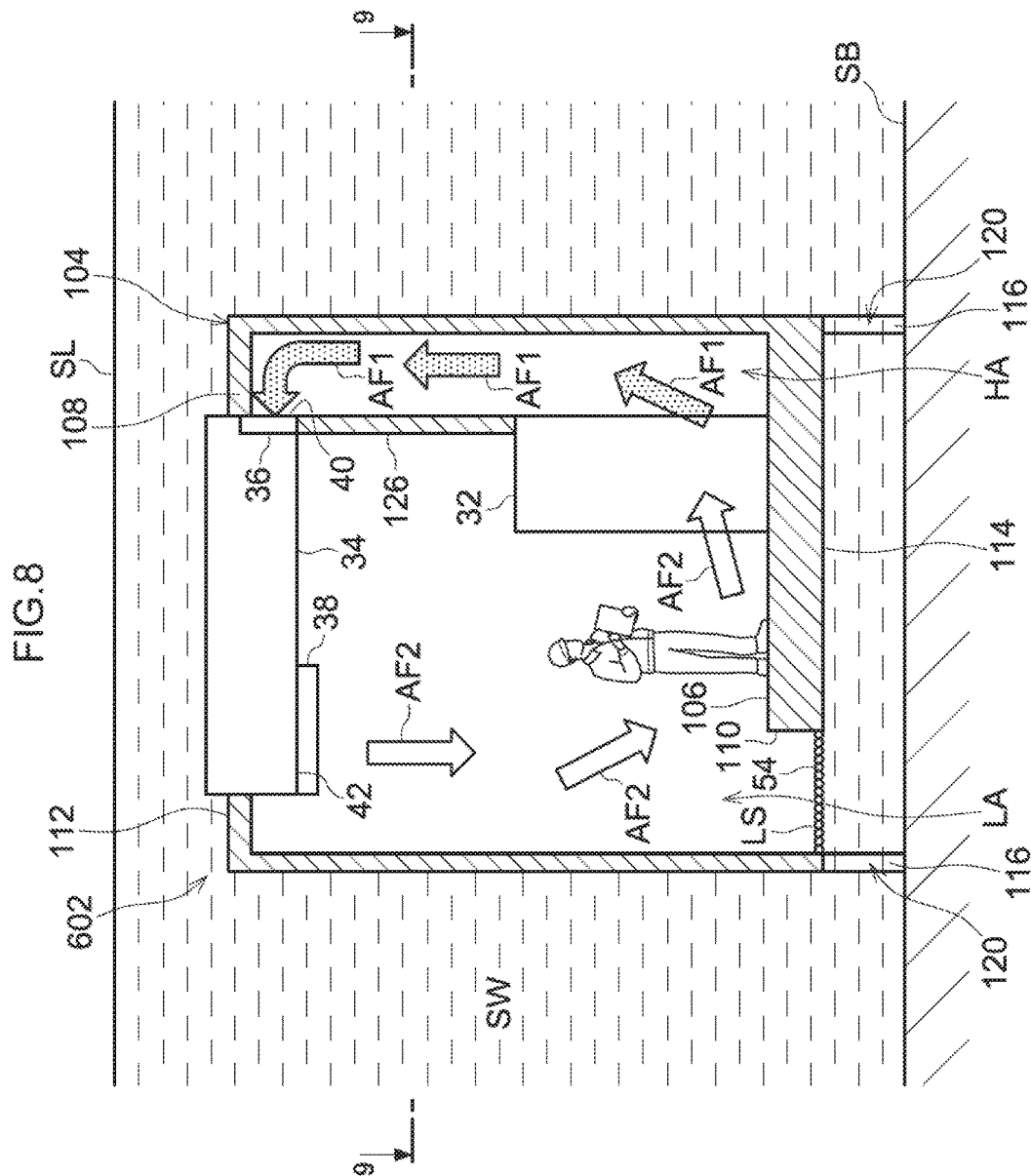
FIG. 8 is a vertical cross-section illustrating an underwater data center of a sixth exemplary embodiment.
Figure 9:
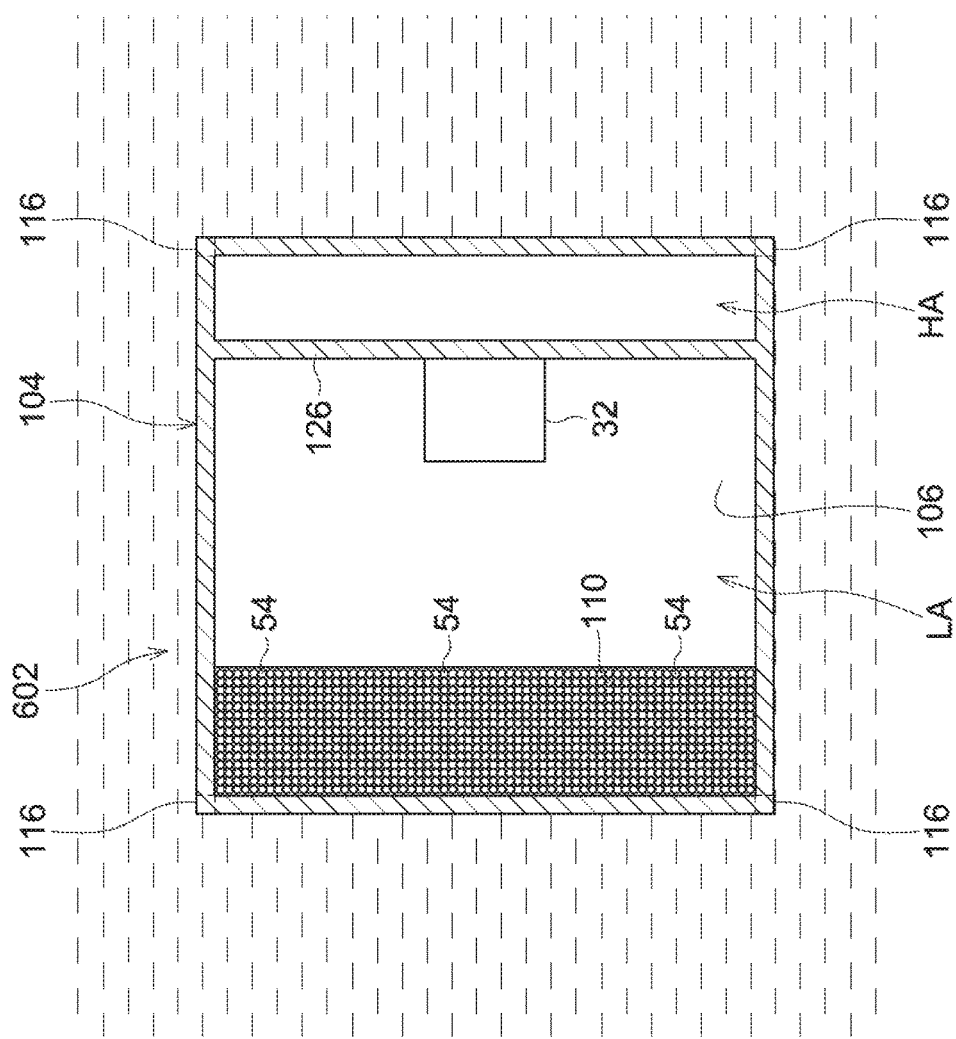
FIG. 9 is a cross-section taken along line 9-9 in FIG. 8 illustrating an underwater data center of the sixth exemplary embodiment.

An underwater data center 602 of the sixth exemplary embodiment illustrated in FIG. 8 and FIG. 9 may include plural floating solid bodies 54 in place of the liquid film 52. Each floating solid body 54 has a lower specific gravity than that of sea water SW, and is a solid body that is insoluble in sea water SW. In the opening 110, the floating solid bodies 54 float on the liquid surface LS of the sea water SW such that the floating solid bodies 54 cover part of the liquid surface LS, thereby suppressing the evaporation of sea water SW. Each floating solid body 54 is a solid body, and is thus easily handled.

In order for a workperson WP to pass through the opening 110, some of the floating solid bodies 54 may be moved so as to secure a space for the workperson WP to pass through. The workperson WP can thereby easily pass through the opening 110. Note that although some of the floating solid bodies 54 may ride up over others of the floating solid bodies 54 when some of the floating solid bodies 54 are moved sideways, this is does not present any particular problems.

Examples of the floating solid bodies 54 include foamed material, pumice, wood, paraffin, and other hydrocarbon compounds. The material of the floating solid bodies 54 is not limited to being a material that itself has a specific gravity lower than that of sea water SW. Namely, even if the specific gravity of the material itself is greater than that of sea water SW, floating solid bodies 54 that float on sea water SW can be obtained by, for example, forming such a material into a boat shape or a hollow shape. Thus, a metal such as aluminum may also be used for the material of the floating solid bodies 54 when the shape of the floating solid bodies 54 is a shape that floats on sea water SW.

Figure 10:
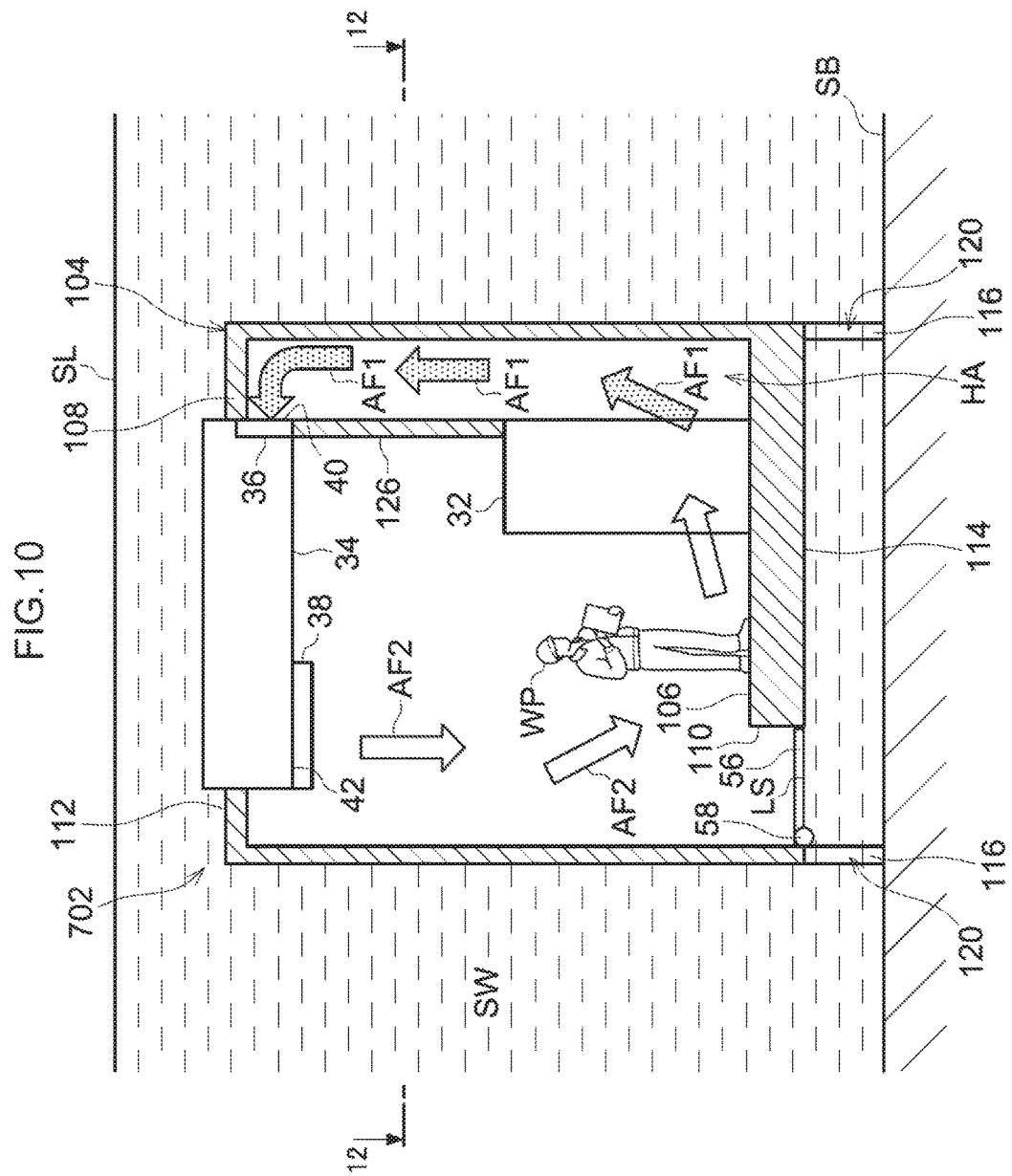
FIG. 10 is a vertical cross-section illustrating an underwater data center of a seventh exemplary embodiment.
Figure 11:
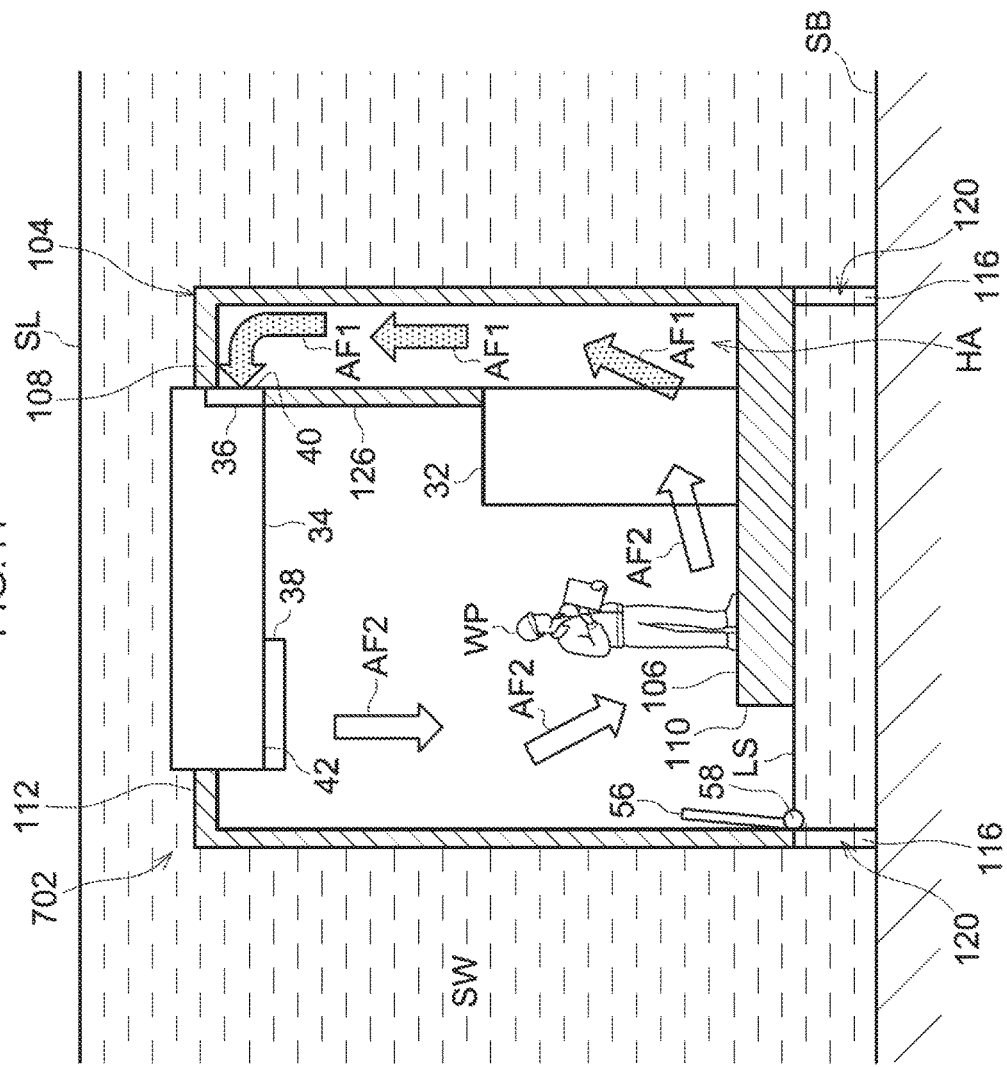
FIG. 11 is a vertical cross-section illustrating an underwater data center of the seventh exemplary embodiment.
Figure 12:
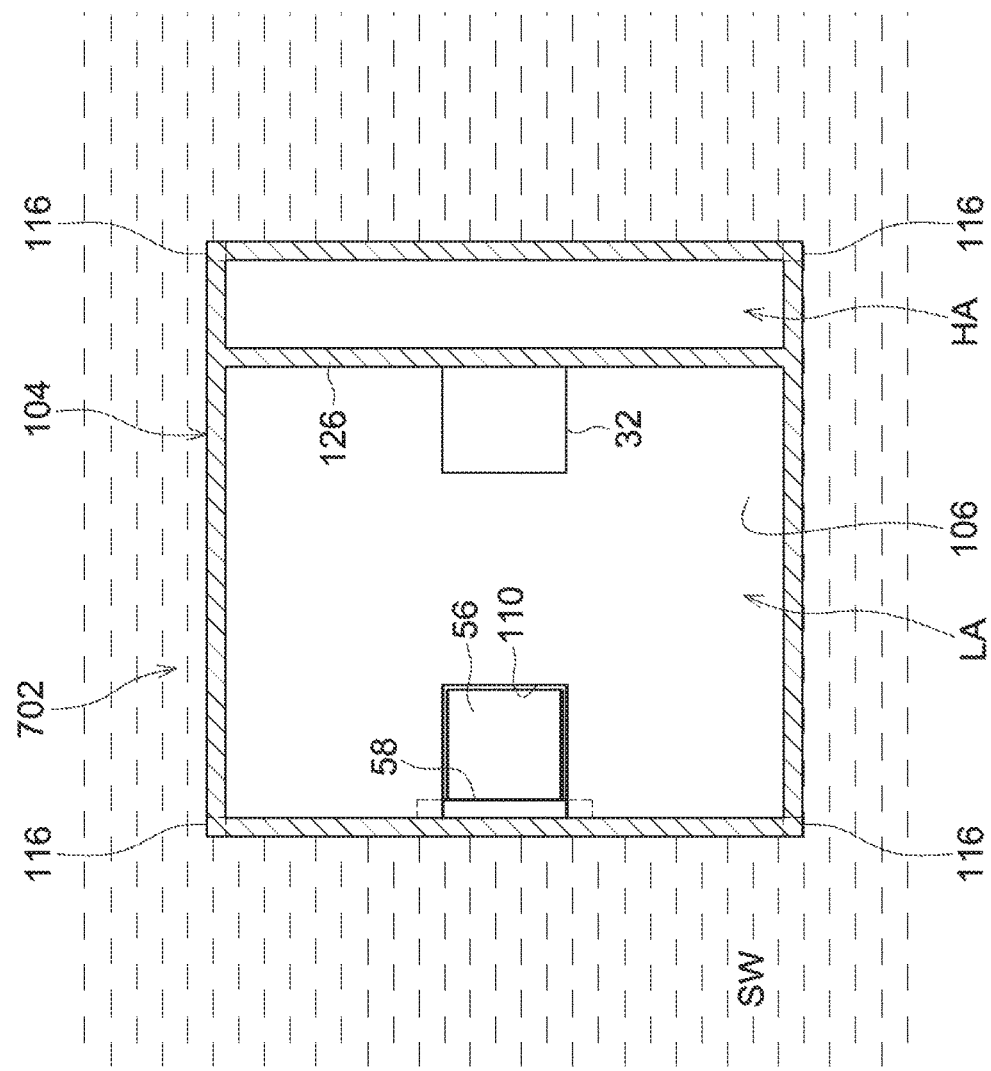
FIG. 12 is a cross-section taken along line 12-12 in FIG. 10 illustrating an underwater data center of the seventh exemplary embodiment.

In an underwater data center 702 of the seventh exemplary embodiment illustrated in FIG. 10 to FIG. 12, a swinging door 56 may be employed in place of the liquid film 52. One end of the swinging door 56 is attached to the housing member 104 by a hinge 58 so as to be capable of swinging. The swinging door 56 swings to adopt the closed state illustrated in FIG. 10 or the open state illustrated in FIG. 11. In the closed state, the swinging door 56 covers the liquid surface LS of the sea water SW. In the open state, the swinging door 56 is swung upward from the liquid surface LS to expose the liquid surface LS. The swinging door 56 is an example of an opening-and-closing member that opens and closes the opening 110.

Figure 13:
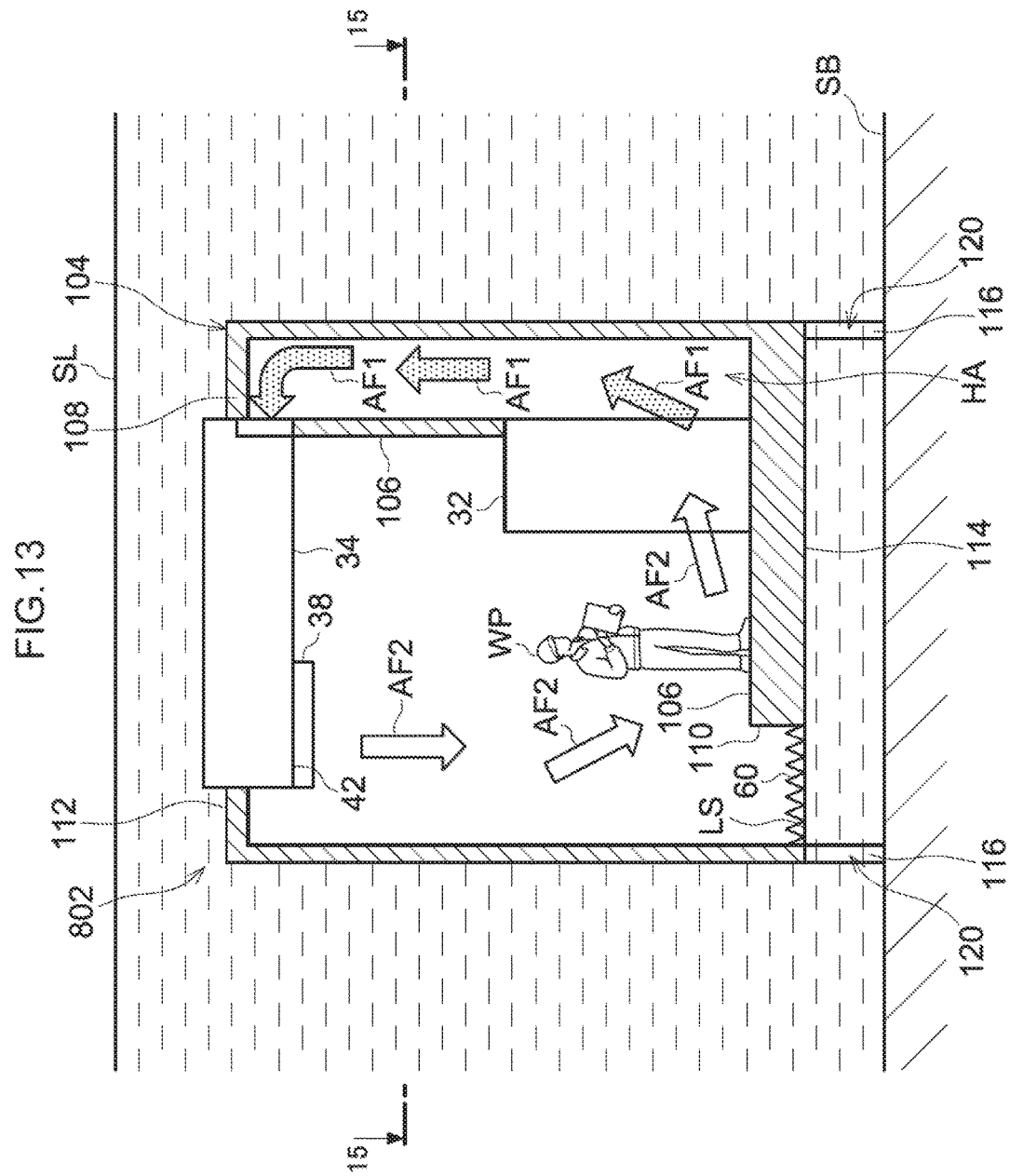
FIG. 13 is a vertical cross-section illustrating an underwater data center of an eighth exemplary embodiment.

In an underwater data center 802 of the eighth exemplary embodiment illustrated in FIG. 13 to FIG. 15, a folding door 60 is employed in place of the liquid film 52. One end of the folding door 60 is fixed to the housing member 104 by a bracket (not illustrated in the drawings). The entire folding door 60 extends or contracts to adopt the closed state illustrated in FIG. 13 or the open state illustrated in FIG. 14. In the closed state, the folding door 60 extends to cover the liquid surface LS of the sea water SW. In the open state, the folding door 60 is contracted to expose part of the liquid surface LS. The folding door 60 is an example of an opening-and-closing member that opens and closes the opening 110.

Note that in the structures of the seventh exemplary embodiment and the eighth exemplary embodiment employing an opening-and-closing member, the housing member 104 can be placed in contact with the sea in an attached state of the swinging door 56 or the folding door 60 to the housing member 104. Besides the swinging door 56 and the folding door 60, an opening-and-closing door that slides to open and close the opening 110 may be employed as the opening-and-closing member.

In contrast thereto, in the structures of the first to the fifth exemplary embodiments employing the liquid film 52 or the floating solid bodies 54, it is sufficient that a liquid (a material for forming the liquid film 52) or floating solid bodies 54, which had been prepared in the housing member 104, be disposed in the opening 110 after the housing member 104 is installed under the sea.

A method in which first, after submerging and anchoring the underwater data center under water, the liquid film 52, floating solid bodies 54, swinging door 56, or folding door 60 is disposed at the liquid surface in the opening 110, may be employed as the installation method of the underwater data center. Since the underwater data center is pre-manufactured on land before being submerged under water, there is no need for underwater manufacturing work or construction work, enabling the underwater installation to be simplified. Moreover, when the underwater data center is expanded in accordance with demand, it is possible to quickly make such installation. Expanding the underwater data center enables more electronic devices to be installed.

Note that in the seventh exemplary embodiment and the eighth exemplary embodiment, the size of the opening 110 is comparatively smaller than that of, for example, the first exemplary embodiment. Thus, a reduction can be achieved in the size of the swinging door 56 or the folding door 60.

Configuration may also be made without the liquid film 52, floating solid bodies 54, swinging door 56, or folding door 60 in the opening 110. For example, although an underwater data center 902 of a ninth exemplary embodiment given in FIG. 16 includes an opening 110, there is no liquid film 52, floating solid bodies 54, swinging door 56, or folding door 60. Even with this structure, since a workperson WP can pass through the opening 110 and enter into the housing member 104, there is no need to raise the underwater data center 902 above the water surface (above the sea level SL) during maintenance work, resulting in excellent serviceability. This enables maintenance work and the like to be performed on the electronic device 32 at a low cost and in a short amount of time.

The structure may also be such that the liquid surface LS of the sea water SW in the opening 110 is not completely covered, and only a portion is covered by the liquid film 52, floating solid bodies 54, swinging door 56, or folding door 60 in a state in which a workperson is not passing through the opening 110. Namely, so long as part of the liquid surface LS is covered, the evaporation of sea water SW can be suppressed at the opening 110 compared to structures in which the liquid surface LS is not covered.

In each of the above exemplary embodiments, although an example was given of a structure that makes contact with the sea bottom SB through the legs 116, the structure may be moored to the sea bottom SB using mooring members 70, as in each of the modified examples illustrated below.

For example, FIG. 17 to FIG. 21 are modified examples of the first to the fifth exemplary embodiments, respectively, in which the housing member 104 is moored to the sea bottom SB using mooring members 70. It is sufficient that the mooring members 70 include one or plural fixing members 72 fixed to the sea bottom SB and a rope 74 (or wire) linking a respective fixing member 72 to the housing member 104. Thus, the structure is not made more complex.

In particular, in cases in which there are severe undulations in the sea bottom SB, in cases in which there is a steep incline in the sea bottom SB, or the like, it is sometimes difficult to place an underwater data center in contact with the sea bottom SB using legs 116. In such cases, the underwater data center can be moored under the sea using the mooring members 70.

Moreover, in a structure in which the underwater data center is moored using the mooring members 70, the underwater data center can be suppressed from inadvertently floating up, even when the specific gravity of the underwater data center is lower than the specific gravity of sea water SW. Making the underwater data center lightweight facilitates overland transportation.

Moreover, the legs 116 are not needed in a structure in which the underwater data center is moored using the mooring members 70. However, a structure that includes legs 116 is applicable both to cases in which the housing member 104, 204, 304, 404, or 504 is installed on the sea bottom SB and to cases in which the housing member 104, 204, 304, 404, or 504 is moored by the mooring members 70, giving the housing member a high degree of versatility.

Although explanation has been given regarding exemplary embodiments of technology disclosed herein, the technology disclosed herein is not limited to the above, and obviously various modifications other than the above may be implemented within a range not departing from the spirit of the present disclosure.

In the technology disclosed herein, persons can enter an underwater data center to perform work such as maintenance or an inspection without having to raise the underwater data center above water. Accordingly, the underwater data center can continue operations during maintenance or inspections without losing cooling functionality.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. An underwater data center, comprising:
   an electronic device;
   a housing member that houses the electronic device and that is configured to be disposed under water;
   a heat exchanger that is provided at the housing member and that is configured to discharge, into the water, heat discharged from the electronic device, with a face of the heat exchanger that discharges the heat making contact with the water,
   an opening being formed in a bottom face of the housing member and placing an inside of the housing member in communication with the water; and
   a liquid film provided at the opening.

2. The underwater data center of claim 1, wherein the liquid film is formed by a nonvolatile liquid that has a lower specific gravity than water and that is insoluble in water.

3. The underwater data center of claim 1, further comprising a partitioning plate that partitions an inside part of the housing member into an inlet side for gas entering the heat exchanger and an outlet side for gas leaving the heat exchanger.

4. The underwater data center of claim 1, wherein an outlet for gas from the heat exchanger faces the electronic device.

5. The underwater data center of claim 1, further comprising a plurality of legs that extend downward from the housing member.

6. The underwater data center of claim 1, further comprising a mooring member that moors the housing member at an installation site.

7. The underwater data center of claim 1, wherein the heat exchanger is mounted to a top face of the housing member.

8. The underwater data center of claim 1, wherein the heat exchanger forms part of the bottom face of the housing member.

9. The underwater data center of claim 1, wherein the housing member has a hemispherical shape that is upwardly convex.

10. An underwater data center comprising:
    an electronic device;
    a housing member that houses the electronic device and that is configured to be disposed under water;
    a heat exchanger that is provided at the housing member and that is configured to discharge, into the water, heat discharged from the electronic device, with a face of the heat exchanger that discharges the heat making contact with the water,
    an opening being formed in a bottom face of the housing member and placing an inside of the housing member in communication with the water; and
    a plurality of floating solid bodies that have a lower specific gravity than water, and that are insoluble in water, are provided at the opening.

11. The underwater data center of claim 10, wherein an outlet for gas from the heat exchanger faces the electronic device.

12. The underwater data center of claim 10, further comprising a plurality of legs that extend downward from the housing member.

13. The underwater data center of claim 10, further comprising a mooring member that moors the housing member at an installation site.

14. The underwater data center of claim 10, wherein the heat exchanger is mounted to a top face of the housing member.

15. The underwater data center of claim 10, wherein the heat exchanger forms part of the bottom face of the housing member.

16. The underwater data center of claim 10, wherein the housing member has a hemispherical shape that is upwardly convex.

17. The underwater data center of claim 10, further comprising a partitioning plate that partitions an inside part of the housing member into an inlet side for gas entering the heat exchanger and an outlet side for gas leaving the heat exchanger.

18. An underwater data center comprising:
an electronic device;
a housing member that houses the electronic device and that is configured to be disposed under water;
a heat exchanger that is provided at the housing member and that is configured to discharge, into the water, heat discharged from the electronic device, with a face of the heat exchanger that discharges the heat making contact with the water,
an opening being formed in a bottom face of the housing member and placing an inside of the housing member in communication with the water; and
an opening-and-closing member that opens and closes the opening is attached to the housing member.

19. The underwater data center of claim 18, further comprising a partitioning plate that partitions an inside part of the housing member into an inlet side for gas entering the heat exchanger and an outlet side for gas leaving the heat exchanger.

20. An underwater data center comprising:
an electronic device;
a housing member that houses the electronic device and that is configured to be disposed under water;
a heat exchanger that is provided at the housing member and that is configured to discharge, into the water, heat discharged from the electronic device, with a face of the heat exchanger that discharges the heat making contact with the water,
an opening being formed in a bottom face of the housing member and placing an inside of the housing member in communication with the water;
a support plate that is provided inside the housing member at a position above the opening;
a gap that is provided at the opening between a liquid surface and the support plate, and
a through-hole, through which gas flows from the gap to the electronic device, is formed in the support plate.

* * * * *